(12) United States Patent
Hashizume

(10) Patent No.: US 6,259,639 B1
(45) Date of Patent: Jul. 10, 2001

(54) SEMICONDUCTOR INTEGRATED CIRCUIT DEVICE CAPABLE OF REPAIRING DEFECTIVE PARTS IN A LARGE-SCALE MEMORY

(75) Inventor: Takeshi Hashizume, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/630,432

(22) Filed: Aug. 1, 2000

(30) Foreign Application Priority Data

Feb. 16, 2000 (JP) .................................................. 12-038773

(51) Int. Cl.[7] ...................................................... G11C 7/00
(52) U.S. Cl. .................... 365/201; 365/200; 365/189.05; 365/189.07
(58) Field of Search ..................................... 365/201, 200, 365/189.07, 189.05, 230.04, 230.05, 189.01, 230.03

(56) References Cited

U.S. PATENT DOCUMENTS 5,946,245 * 8/1999 Brown et al. ........................ 365/201

FOREIGN PATENT DOCUMENTS

| 2-78089 | 3/1990 | (JP) . |
| 3-57048 | 3/1991 | (JP) . |
| 4-372798 | 12/1992 | (JP) . |

* cited by examiner

*Primary Examiner*—David Nelms
*Assistant Examiner*—David Lam
(74) *Attorney, Agent, or Firm*—Burns, Doane, Swecker & Mathis, LLP

(57) ABSTRACT

A semiconductor integrated circuit device comprises a memory cell unit, and a data latch unit for temporarily latching write data, which is written into the memory cell unit by way of a normal port. A comparator reads the data, which has been written into the memory cell unit by way of the normal port, from the memory cell unit by way of a test port, and then compares the read data with the original write data latched by the data latch unit. When the comparator detects a mismatch between them, a redundant unit latches the write data to take the place of the memory cell unit and an address holding unit latches information on an address identifying a location of the memory cell unit into which the write data has been written.

16 Claims, 22 Drawing Sheets

FIG.25

| CIRCLE | OPERATION | TEST OPERATION | BUFFER MEMORY |
|---|---|---|---|
| 1 | WRITE A | | A |
| 2 | | COMP A | A |
| 3 | READ A | | |
| 4 | | | |
| 5 | WRITE B | | B |
| 6 | WRITE C | | B & C |
| 7 | | COMP B | B &C |
| 8 | | COMP C | C |
| 9 | READ B | | |
| 10 | READ C | | |
| 11 | | | |
| 12 | WRITE A | | A |
| 13 | READ B | | A |
| 14 | | COMP A | A |
| 15 | WRITE C | | C |
| 16 | READ A | | C |
| 17 | | COMP C | C |

SEMICONDUCTOR INTEGRATED CIRCUIT DEVICE CAPABLE OF REPAIRING DEFECTIVE PARTS IN A LARGE-SCALE MEMORY

BACKGROUND OF THE INVENTION

1. Field of the Invention

The present invention relates to a semiconductor integrated circuit device on which a large-scale memory circuit is mounted.

2. Description of the Prior Art

With recent improvements in the semiconductor machining technology, it has become possible to mount a large-scale memory cell unit on semiconductor integrated circuit devices. In general, large-scale memory cell units have a larger packaging density than logic circuits, and therefore can be easily failed components. Conventionally, repair techniques of preparing redundant areas, and making each of the redundant areas take the place of a defective word or bit in a memory cell, which is found by a post-manufacturing test, have been used as a method of repairing defective parts of a memory cell unit during manufacturing. Repair techniques include a fuse-type memory repair technique of physically opening the circuit formed by a fuse corresponding to a defective part to disconnect the defective part from a memory cell unit using laser light, and substituting a redundant unit for the defective part. Japanese patent application publication (TOKKAIHEI) No. 4-372798 discloses such a repair method of repairing defective parts in a memory cell unit located in a prior art semiconductor integrated circuit device.

A problem with a prior art semiconductor integrated circuit device constructed as above is that the use of a fuse-type memory repair technique of physically opening the circuit formed by a fuse corresponding to a defective part to disconnect a defective part from a memory cell unit disposed in a large-scale memory increases the manufacturing cost because of a physical post-manufacturing wiring and testing of the large-scale memory.

SUMMARY OF THE INVENTION

The present invention is proposed to solve the above problem. It is therefore an object of the present invention to provide a semiconductor integrated circuit device capable of repairing defective parts in a large-scale memory cell unit mounted thereon without increasing the manufacturing cost.

In accordance with one aspect of the present invention, there is provided a semiconductor integrated circuit device comprising: a memory cell unit having a normal port via which a normal read/write operation is performed, and a test port intended for tests, via which data can be read out of the memory cell unit; a data latch unit for temporarily latching write data, which is written into the memory cell unit by way of the normal port; a comparator for reading the data, which has been written into the memory cell unit by way of the normal port, from the memory cell unit by way of the test port, and for comparing the read data with the original write data latched by the data latch unit; a redundant unit for latching the write data to take the place of the memory cell unit when the comparator detects a mismatch between the data read by the comparator and the write data latched by the data latch unit; and an address holding unit for holding information on an address identifying a location of the memory cell unit into which the write data has been written when the comparator detects a mismatch between the data read by the comparator and the write data.

In accordance with a preferred embodiment of the present invention, the data latch unit includes a plurality of data latches each for temporarily latching write data, which is written into the memory cell unit by way of the normal port. Further, when reading data from a location at an address, in which a mismatch was found by the comparator, of the memory cell unit for the first time, the device furnishes write data latched by a corresponding one of the plurality of data latches, and, from then on, when performing a write/read operation to access the address, directly accesses the redundant unit that is holding the write data associated with the address stored in the address holding unit without performing a comparison by means of the comparator.

In accordance with another preferred embodiment of the present invention, the data latch unit includes only one data latch for temporarily latching write data, which is written into the memory cell unit by way of the normal port. When the write data is written into the memory cell unit, the comparator compares the write data latched by the data latch with corresponding data read out of the memory cell unit, and, if the comparator detects a mismatch between them, the redundant unit latches the write data and the address holding unit latches an address identifying a location of the memory cell unit into which the write data has been written. After that, when the comparator performs a comparison associated with the same address and then detects a match, the address is cleared from the address holding unit or the address can be overwritten with a new one, and the write data is cleared from the redundant unit or the write data can be overwritten with new data.

In accordance with another preferred embodiment of the present invention, the data latch unit includes only one data latch for temporarily latching write data, which is written into the memory cell unit by way of the normal port. When the write data is written into the memory cell unit, the redundant unit can latch the write data and the address holding unit can latch an address identifying a location of the memory cell unit into which the write data has been latched. The comparator then compares the write data latched by the data latch with corresponding data read out of the memory cell unit, and, if the comparator detects a mismatch between them, the redundant unit keeps holding the write data latched thereinto and the address holding unit keeps holding the address latched thereinto. Otherwise, the address is cleared from the address holding unit or the address can be overwritten with a new one, and the write data is cleared from the redundant unit or the write data can be overwritten with new data.

Preferably, the semiconductor integrated circuit device can further comprise an address decoder unit for decoding an incoming address applied thereto when performing a read/write operation, the address decoder unit including a first decoder for activating word lines connected to the redundant unit, and a second decoder for activating word lines connected to the memory cell unit. Further, the address holding unit can determine whether or not it is holding an address equal to the incoming address, and, if the address holding unit determines that it is holding an address equal to the incoming address, the first decoder activates a corresponding word line connected to the redundant unit, and, otherwise, the second decoder activates a corresponding word line connected to the memory cell unit.

In accordance with another preferred embodiment of the present invention, when the redundant unit does not have free space enough to take the place of the memory cell unit, the device asserts a full flag signal. As an alternative, when the redundant unit does not have free space enough to take the place of the memory cell unit and the comparator detects a mismatch between write data latched by the data latch unit and corresponding data read out of the memory cell unit, the device asserts an overflow signal.

In accordance with another aspect of the present invention, there is provided a semiconductor integrated circuit device comprising: a memory cell unit having a normal port via which a read/write operation is performed, and a test port intended for tests, via which data can be read out of the memory cell unit; a data latch unit for temporarily latching write data, which is written into the memory cell unit by way of the normal port; a comparator for reading the data, which has been written into the memory cell unit by way of the normal port, from the memory cell unit by way of the test port, and for comparing the read data with the original write data latched by the data latch unit bit by bit; an address and bit information holding unit for, if the comparator detects a mismatch between the data read by the comparator and the write data, holding information on an address identifying a location of the memory cell unit into which the write data has been written and bit information about one or more bits of the write data in which a mismatch has been found by the comparator; and a unit for, when reading the data from the address of the memory cell unit, in which a mismatch was found by the comparator, inverting one or more bits of the data read out of the memory cell unit according to the bit information stored in the address and bit information holding unit.

In accordance with another aspect of the present invention, there is provided a semiconductor integrated circuit device comprising: an odd number of memory cell units having respective address decoders and having different structures, the number of memory cell units being greater than or equal to three, identical write data being written into the plurality of memory cell units when a write operation is performed so that they have identical contents; and a majority determination unit for, when a read operation is performed and an identical address is applied to the plurality of memory cell units, determining a majority of an odd number of data which are read out of locations identified by the address of the plurality of memory cell units, so as to determine if each of the plurality of memory cell units has a defective part, and for furnishing the majority as read data.

In accordance with another aspect of the present invention, there is provided a semiconductor integrated circuit device comprising: a memory cell unit including an odd number of memory cells into which each bit of write data is written when a write operation is performed so that they have identical contents, the number of memory cells being greater than or equal to three; and a majority determination unit for, when a read operation is performed on the write data written into the memory cell unit, determining a majority of an odd number of one-bit data corresponding to each bit of the write data which are read out of the plurality of memory cells, so as to determine whether or not each of the plurality of memory cells for storing each bit of the write data is defective, and for furnishing the majority as each bit of read data.

In accordance with another aspect of the present invention, there is provided a semiconductor integrated circuit device comprising: a plurality of memory cell units into which identical write data is written when a write operation is performed so that they have identical contents; a parity bit holding unit for, when the write data is written into the plurality of memory cell units, calculating and holding a parity bit for the write data; and a comparator for, when a read operation is performed, comparing a plurality of data read out of the plurality of memory cell units with one another, and for, unless they are equal to one another, checking the parity bit stored in the parity bit holding unit and selecting a correct one of the plurality of data read from the plurality of memory cell units to furnish the selected data.

In accordance with another aspect of the present invention, there is provided a semiconductor integrated circuit device including at least a memory block, the device comprising: a self-test-pattern generating unit for generating and furnishing a set of address and data, as a test pattern, to the memory block; and the memory block including a memory cell unit, a data latch unit for temporarily latching write data, which is written into the memory cell unit, a comparator for reading the data, which has been written into the memory cell unit, from the memory cell unit, and for comparing the read data with the original write data latched by the data latch unit, a redundant unit for latching the write data to take the place of the memory cell unit from then on when the comparator detects a mismatch between the data read by the comparator and the write data, an address holding unit for holding information on an address identifying a location of the memory cell unit into which the write data is written when the comparator detects a mismatch between the data read by the comparator and the write data, an address input selector for selecting and furnishing an address, which is applied thereto from the self-test-pattern generating unit when the memory cell unit is tested, to the memory cell unit, and a data input selector for selecting and furnishing data, which is applied thereto from the self-test-pattern generating unit when the memory cell unit is tested, to the memory cell unit.

In accordance with a preferred embodiment of the present invention, the device comprises a plurality of memory blocks, each having the memory cell unit, the comparator, the redundant unit, the address holding unit, the address input selector, and the data input selector, and the self-test-pattern generating unit furnishes a set of address and data, as a test pattern, to the plurality of memory blocks when testing the plurality of memory blocks, and wherein each of the plurality of memory blocks furnishes a full flag signal when the redundant unit thereof does not have free space enough to take the place of the memory cell unit thereof, and the device further comprises an OR gate for implementing a logical OR operation on a plurality of full flag signals from the plurality of memory blocks.

In accordance with another preferred embodiment of the present invention, the device comprises a plurality of memory blocks, each having the memory cell unit, the comparator, the redundant unit, the address holding unit, the address input selector, and the data input selector, and the self-test-pattern generating unit furnishes a set of address and data, as a test pattern, to the plurality of memory blocks when testing the plurality of memory blocks, and wherein each of the plurality of memory blocks furnishes an overflow flag signal when the redundant unit thereof does not have free space enough to take the place of the memory cell unit thereof and the comparator thereof detects a mismatch between write data and corresponding data read out of the memory cell unit, and the device further comprises an OR gate for implementing a logical OR operation on a plurality of overflow signals from the plurality of memory blocks.

In accordance with another aspect of the present invention, there is provided a semiconductor integrated circuit device comprising: a memory cell unit; a data latch unit for temporarily latching write data, which is written into the memory cell unit; a comparator for reading the data, which has been written into the memory unit, from the memory cell unit, and for comparing the read data with the original write data latched by the data latch unit; a redundant unit for latching the write data to take the place of the memory cell unit after then on when the comparator detects a mismatch between the data read by the comparator and the write data; an address buffer unit for latching an incoming address identifying a location of the memory cell unit into which the write data is written; an address holding unit for holding information about the incoming address when the comparator detects a mismatch between the data read by the comparator and the write data; and an address input selector for reading the incoming address from the address buffer unit when any read/write operation is disabled, and furnishing the address to the memory cell unit, the comparator being enable only when any read/write operation is disabled.

In accordance with another aspect of the present invention, there is provided a semiconductor integrated circuit device comprising: a memory cell unit; a data row storage unit for storing one or more data rows that are frequently accessed and one or more data rows that need much time to be processed, the data row unit having a smaller storage amount than the memory cell unit has; and an address information storage mean for storing addresses identifying locations of the data row storage unit where data rows are stored, and for, when an access to a data row that is frequently accessed or that needs much time to be processed is made, selecting and furnishing an address identifying a location where the data row is stored to the data row storage unit.

Further objects and advantages of the present invention will be apparent from the following description of the preferred embodiments of the invention as illustrated in the accompanying drawings.

BRIEF DESCRIPTION OF THE DRAWINGS

FIG. 25 is a diagram showing the operation of the memory block according to the thirteenth embodiment at every clock cycle.

DETAILED DESCRIPTION OF THE PREFERRED EMBODIMENTS

Embodiment 1

Figure 1:
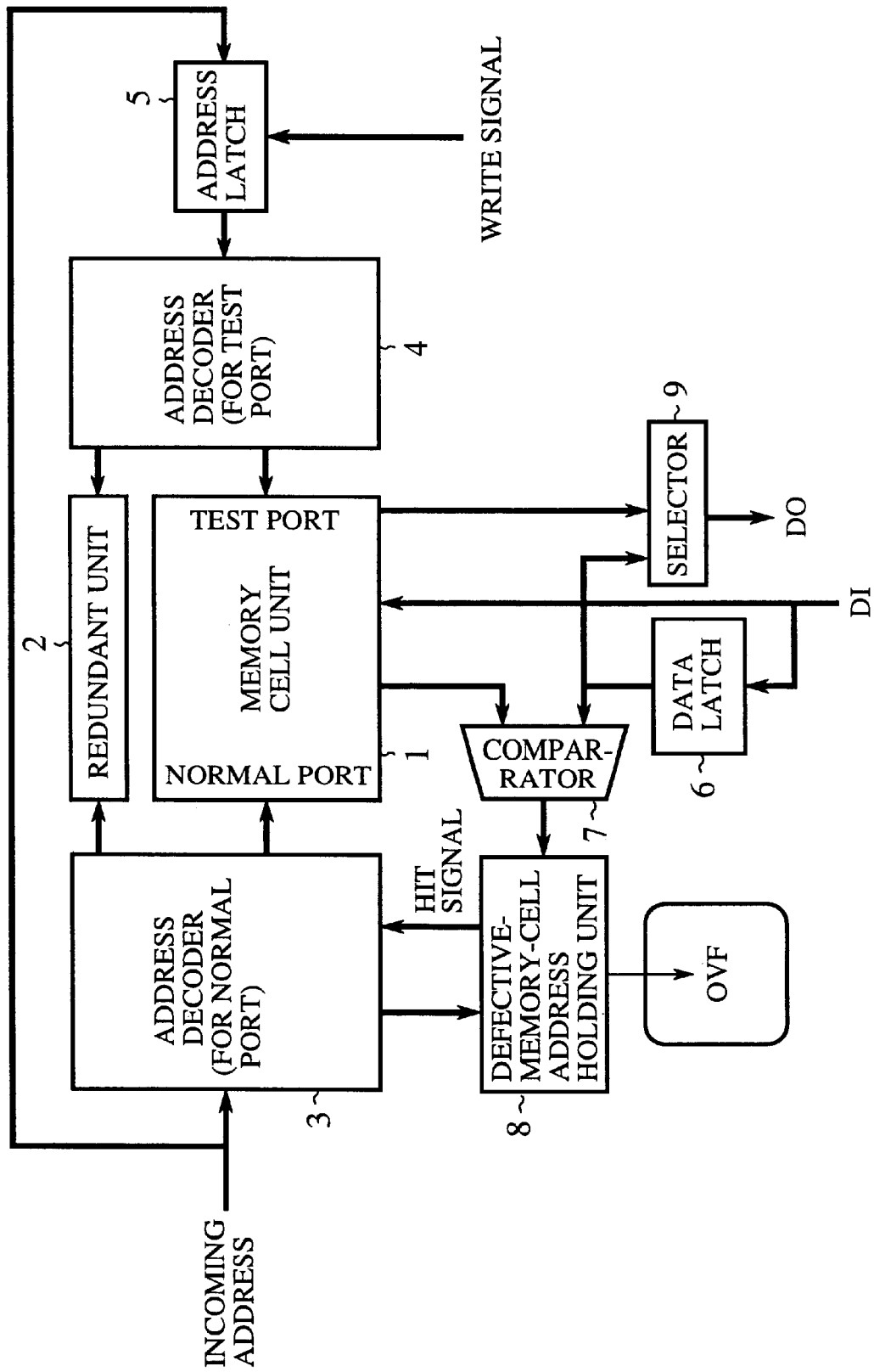
FIG. 1 is a block diagram showing the structure of a memory block mounted on a semiconductor integrated circuit device according to a first embodiment of the present invention.

Referring next to FIG. 1, there is illustrated a block diagram showing the structure of a memory block mounted on a semiconductor integrated circuit device according to a first embodiment of the present invention. In the figure, reference numeral 1 denotes a memory cell unit in which a required number of memory cells are arranged, the memory cell unit having a read/write port (or normal port) intended for normal read/write operations, and a read port (or test port) intended for tests, numeral 2 denotes a redundant unit prepared for taking the place of defective part of the memory cells disposed within the memory cell unit 1 to perform the function of the defective part, the redundant unit 2 having a read/write port (or normal port) intended for normal read/write operations, and a read port (or test port) intended for tests, numeral 3 denotes a first address decoder intended for the normal ports of the memory cell unit 1 and the redundant unit 2, numeral 4 denotes a second address decoder intended for the test ports of the memory cell unit 1 and the redundant unit 2, and numeral 5 denotes an address latch for temporarily holding an address applied to the second address decoder 4.

Reference numeral 6 denotes a data latch for temporarily latching incoming data input from a data input terminal DI, numeral 7 denotes a comparator for comparing the original write data latched by the data latch 6 with corresponding data read out of the memory cell unit 1 via the test port at the expiration of a clock cycle after the write data has been applied to the data input terminal, and numeral 8 denotes a defective-memory-cell address holding unit for holding an incoming address which was applied to the first address decoder 3 in the previous clock cycle when the comparator 7 detects a mismatch between the write data latched by the data latch 6 and the data read out of the test port of the memory cell unit 1. When the defective-memory-cell address holding unit 8 cannot serve its essential function by means of a number of address registers located therein because the memory cell unit 1 has many defective parts, the defective-memory-cell address holding unit 8 generates an overflow signal OVF. Reference numeral 9 denotes a selector for selecting either data read out of the memory cell unit 1 via the normal port or the write data latched by the data latch 6, and for furnishing the selected data by way of a data output terminal DO. The redundant unit 2 includes a plurality of memory cells (not shown), the data latch 6 includes a plurality of latches (not shown), and the defective-memory-cell address holding units 8 includes a plurality of defective-memory-cell address holding registers (not shown).

In operation, an incoming address is directly applied to the first address decoder 3 and is also input to the address latch 5 located at the front of the second address decoder 4. When a write operation is performed, the address latch 5 can temporarily hold the incoming address in response to a write signal applied thereto from outside the memory block. When a normal port write access is made, data is read out of the memory cell unit 1 via the test port at the expiration of one clock cycle after the incoming address and data have been applied to the memory block. Since the read operation via the test port is thus carried out in the next clock cycle of the normal port write access, the test port address decoding operation using the second address decoder 4 can be performed only after the normal port write operation has been done, and the address latch 5 can perform the address latching operation only in the next clock cycle of the normal port write access.

When a write operation is performed, incoming data from the data input terminal DI is temporarily latched into the data latch 6, and is also input to the memory cell unit 1 by way of the normal port and is then written into a memory cell identified by the incoming address. At the expiration of one clock cycle after the incoming address and data have been applied to the memory block, the comparator 7 compares the original write data latched by the data latch 6 with corresponding data read out of the location at the address of the memory cell unit 1 by way of the test port so as to determine whether they match. If they match, the comparator 7 can determine that the write/read accesses to the address of the memory cell unit 1 have been made properly. After that, any access to the address will be made by actually accessing the address of the memory cell unit 1. In contrast, when the comparator 7 detects a mismatch between the write data latched by the data latch 6 and the data read out of the memory cell unit 1 by way of the test port, it can determine that the memory cell unit 1 has a defective memory cell identified by the address and allow the defective-memory-cell address holding unit 8 to latch the address as a defective-memory-cell address. After that, any access to the address will be made through the redundant unit 2.

When a write/read operation is performed, the defective-memory-cell address holding unit 8 determines whether it is holding a defective-memory-cell address equal to the input address applied to the first address decoder 3. If the defective-memory-cell address holding unit 8 finds a hit, it generates and furnishes a hit signal to the first address decoder 3 so that the first address decoder 3 makes the redundant unit 2 perform the write/read operation in place of a corresponding part of the memory cell unit 1 which is identified by the input address. Since the data latch 6 is holding the write data which has been written into the address for the first time, the write data latched by the data latch 6 is furnished by way of the data output terminal DO when the first read access to the write data is made.

As previously mentioned, the redundant unit 2 includes a plurality of memory cells (not shown), the data latch 6 includes a plurality of latches (not shown), and the defective-memory-cell address holding units 8 includes a plurality of defective-memory-cell address holding registers (not shown), in order to address a plurality of defective memory cells that may exist in the memory cell unit 1. When a write access to a defective-memory-cell address, which is to be processed by the redundant unit 2, is made, it is possible to control the comparator 7 so as not to determine whether the write data latched by the data latch 6 matches the corresponding data read out of the memory cell unit 1 because the memory block has already known that the memory cell unit 1 has a defective part identified by the input address. When the defective-memory-cell address holding unit 8 cannot serve its essential function using a number of prepared addresses (i.e., address registers) because the memory cell unit 1 has many defective parts, the defective-memory-cell address holding unit 8 generates an overflow signal OVF so as to notify the system or semiconductor integrated circuit device of an occurrence of a memory failure.

Figure 2:
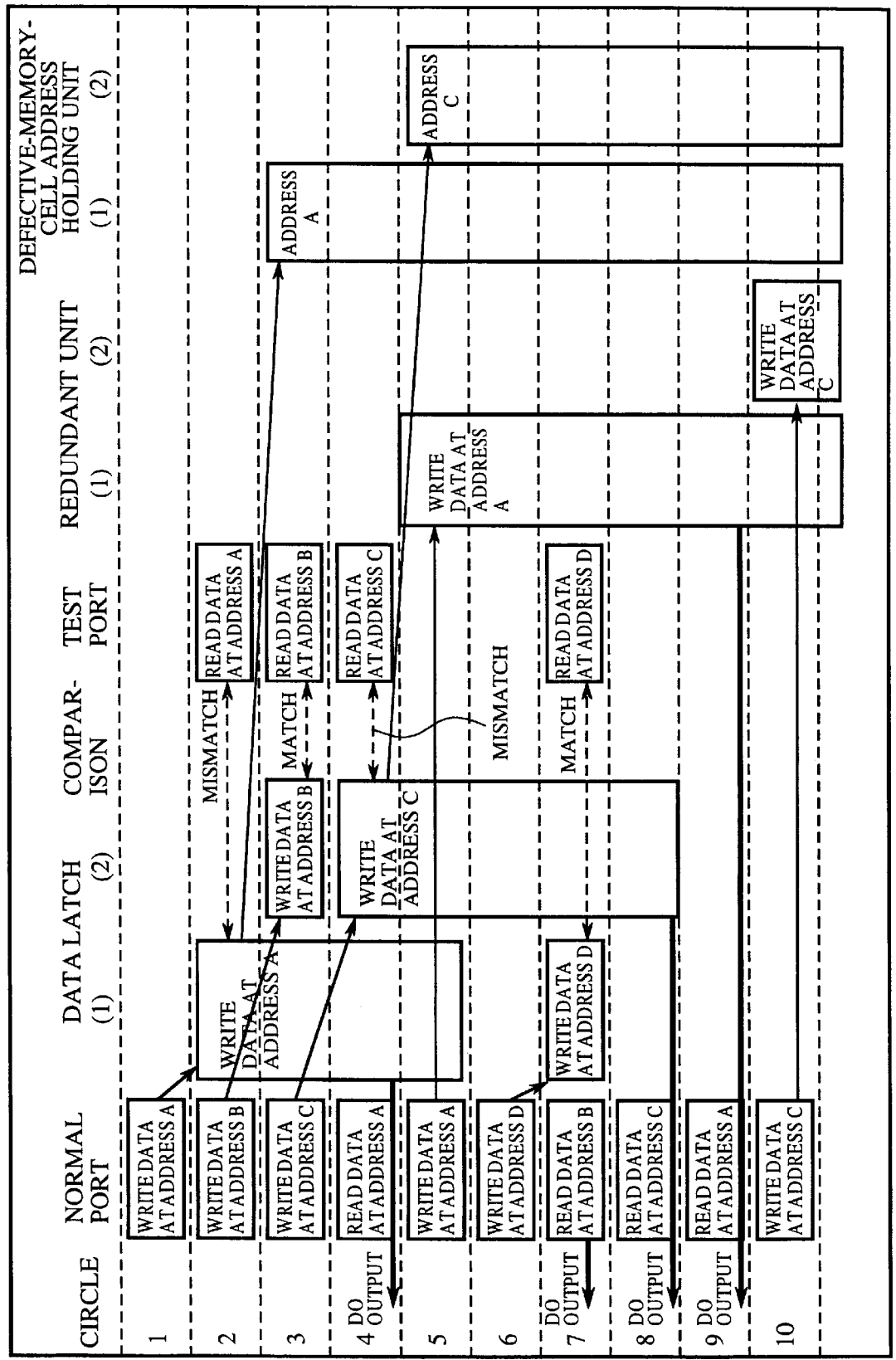
FIG. 2 is a diagram showing the operation of the memory block according to the first embodiment at every clock cycle.

Referring next to FIG. 2, there is illustrated a diagram showing the operation of the memory block according to the first embodiment at every clock cycle. For simplicity, in FIG. 2, it is assumed that the redundant unit 2 includes two memory cells, the data latch 6 includes two latches, and the defective-memory-cell address holding unit 8 includes two address registers. Next, a description will be made as to the operation of the memory block with reference to FIG. 2.

In the first clock cycle, write data, which is to be written into a location at an address A of the memory cell unit 1, is applied to the normal port of the memory cell unit 1. Next, in the second clock cycle, a latch (1) of the data latch 6 latches the original write data written into the address A, which was applied to the normal port in the previous clock cycle (i.e., first clock cycle), and the comparator 7 then compares the write data latched by the data latch (1) with corresponding read data read out of the address A of the memory cell unit 1 via the test port. When the comparator 7 detects a mismatch between them, it furnishes the address A to a corresponding address register (1) of the defective-memory-cell address holding unit 8 and the defective-memory-cell address register (1) then latches the address A. In addition, other write data to be written into a location at an address B of the memory cell unit 1 is applied to the normal port in the second clock cycle.

In the third clock cycle, the data latch 6 latches the write data written into the address B, which was applied to the normal port in the previous clock cycle (i.e., second clock cycle). In this case, since the first latch (1) has already latched the first write data associated with the address A held by the first defective-memory-cell address register (1), another latch (2) of the data latch 6 latches the write data written into the address B. The comparator 7 then compares the second write data written into the address B, which is being held by the second latch (2), with corresponding read data read out of the address B of the memory cell unit 1 via the test port. When the comparator 7 detects a match between them, it can determine that the data written into the address B can be read out of the memory cell unit 1 properly. Accordingly, when reading the data from the address B, the data written into the memory location at the address B of the memory cell unit 1 can be actually read. In other words, the defective-memory-cell address holding unit 8 does not hold the address B and the redundant unit 2 does not hold the write data associated with the address B. Since the second latch (2) does not need to hold the second write data which has already been latched into the address B, new data can be overwritten into the second latch (2) in the next clock cycle. In addition, write data to be written into a location at an address C of the memory cell unit 1 is applied to the normal port in the third clock cycle.

In the fourth clock cycle, the data latch 6 latches the write data written into the address C, which was applied to the normal port in the previous clock cycle (or third clock cycle). In this case, since the first latch (1) has already latched the first write data associated with the address A held by the first defective-memory-cell address register (1) and new data can be overwritten into the second latch (2), the second latch (2) latches the write data written into the address C. The comparator 7 then compares the third write data written into the address C, which is being held by the second latch (2), with corresponding read data read out of the address C of the memory cell unit 1 via the test port. When the comparator 7 detects a mismatch between them, it furnishes the address C to the second address register (2) of the defective-memory-cell address holding unit 8 and the second defective-memory-cell address register (2) then latches the address C. In addition, in the fourth clock cycle, an operation of reading the data at the address C is preformed by way of the normal port of the memory cell unit 1. Since the address A matches the address held by the first defective-memory-cell address register (1) and the read operation is a read access to the first write data that was written into the address A for the first time, the selector 9 selects the data held by the first latch (1) and then furnishes the data as the read data stored in the address A by way of the data output terminal DO.

Next, in the fifth clock cycle, a second operation of writing data into the address A is performed by way of the normal port of the memory cell unit 1. Since the address A is being held, as a defective-memory-cell address, by the first defective-memory-cell address register (1), the write access is made to a memory cell (1) of the redundant unit 2, not the address A of the memory cell unit 1. Since the new write data, which is to be written into the address A, is written into the first memory cell of the redundant unit 2, the previous write data is cleared from the first latch (1) of the data latch 6. Then, other write data to be written into a location at an address D of the memory cell unit 1 is applied to the normal port in the sixth clock cycle.

In the seventh clock cycle, the first latch (1) latches the write data written into the address D, which was applied to the normal port in the previous clock cycle (i.e., sixth clock cycle). The comparator 7 then compares the write data written into the address D, which is being held by the first latch (1), with corresponding read data read out of the address D of the memory cell unit 1 via the test port. When the comparator 7 detects a match between them, it can determine that the data written into the address D can be read out of the memory cell unit 1 properly. Accordingly, when reading the data from the address D, the data written into a memory location at the address D of the memory cell unit 1 can be actually read. In other words, the defective-memory-cell address holding unit 8 does not hold the address D and the redundant unit 2 does not hold the data. Since the first latch (1) thus does not need to latch the write data, which has already been written into the address D, new data can be overwritten into the first data latch (1) in the next clock cycle. In addition, an operation of reading data from the address B is performed by way of the normal port of the memory cell unit 1. In this case, since the defective-memory-cell address holding unit 8 is not holding the address B as a defective-memory-cell address, a normal read operation is carried out using the memory cell unit 1.

In the eighth clock cycle, an operation of reading data from the address C is performed by way of the normal port of the memory cell unit 1. Since the address C matches the address held by the second defective-memory-cell address register (2) and the read operation is a read access to the write that was written into the address C for the first time, the selector 9 selects the write data held by the second latch (2) and then furnishes the selected data, as the read data, by way of the data output terminal DO. In the ninth clock cycle, an operation of reading data from the address A is performed by way of the normal port of the memory cell unit 1. Since the address A has already been latched by the first defective-memory-cell address register (1), the selector 9 selects the write data held by the corresponding memory cell (1) of the redundant unit 2 and then furnishes the selected data, as the read data, by way of the data output terminal DO.

In the tenth clock cycle, a second operation of writing data into the address C is performed by way of the normal port of the memory cell unit 1. Since the address C is being held, as a defective-memory-cell address, by the second defective-memory-cell address register (2), the new write data is written into a second memory cell (2) of the redundant unit 2.

Figure 3:
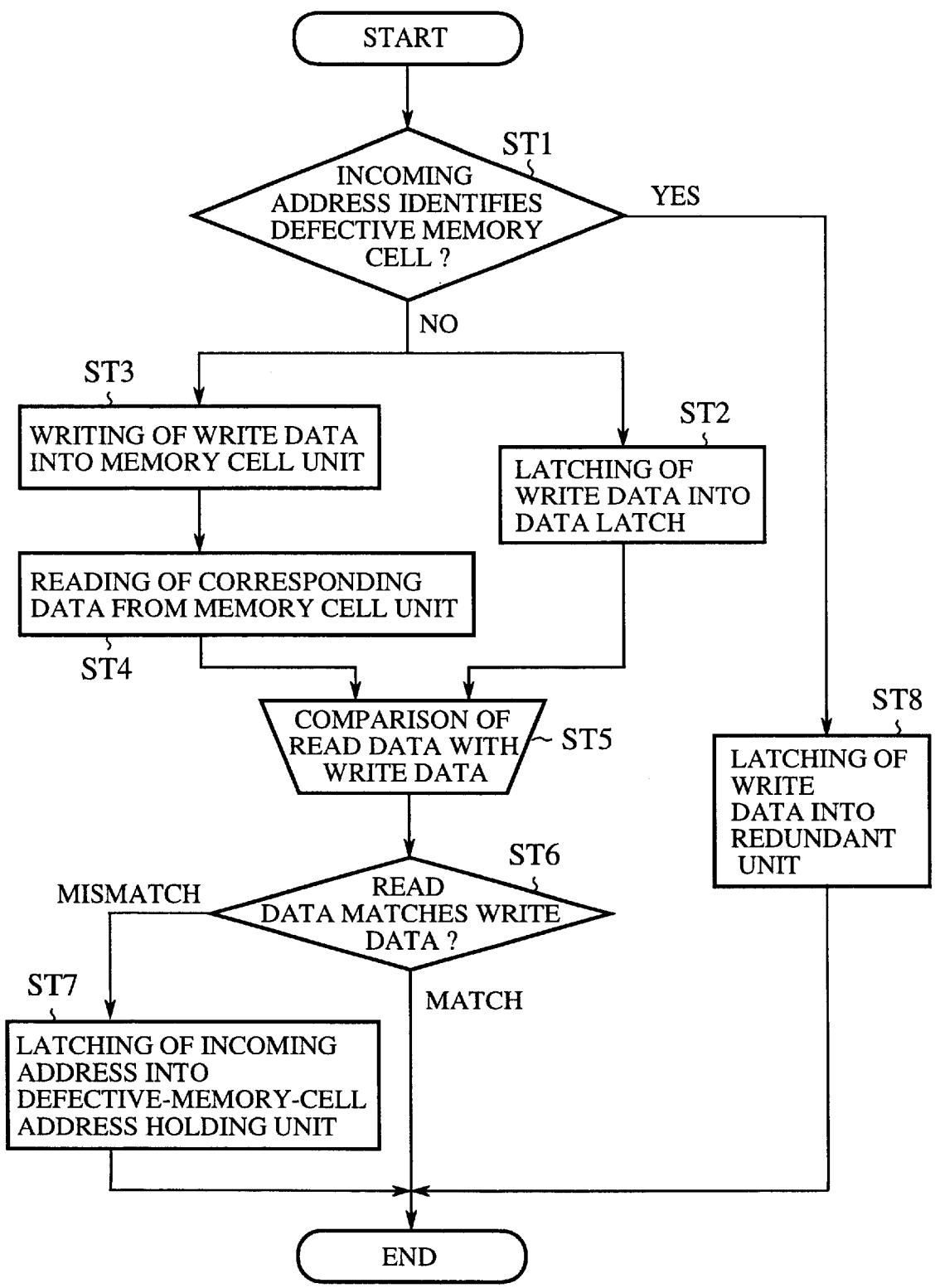
FIG. 3 is a flow diagram showing a procedure of writing data into the memory block according to the first embodiment.

Referring next to FIG. 3, there is illustrated a flow diagram showing a procedure of writing data into the memory block as shown in FIG. 2.

When performing a write operation, the memory block, in step ST1, determines whether an incoming address to which the write access is to be made matches one of addresses being held by the defective-memory-cell address holding unit 8. Unless any one of addresses stored in the defective-memory-cell address holding unit 8 matches the incoming address applied to the first address decoder 3, the memory block, in step ST2, allows the data latch 6 to latch the write data. The write data is, in step ST3, written into a location at the address of the memory cell unit 1 by way of the normal port, and corresponding data is then read out of the location of the memory cell unit 1 by way of the test port in step ST4. The comparator then, in step ST5, compares the write data latched by the data latch 6 with the corresponding data read out of the memory cell unit via the test port in step ST4, and, in step ST6, determines if they match. As a result, when the comparator 7 determines that they don't match, the memory block advances to step ST7 in which the first address decoder 3 furnishes the address to which the write access is to be made into the defective-memory-cell address holding unit 8, so that the defective-memory-cell address holding unit 8 latches the address as a defective-memory-cell address. In contrast, when there is a match between the write data latched by the data latch with the corresponding data read out of the memory cell unit via the test port in step ST4, the memory block ends the write operation.

When the incoming address to which the write access is to be made, in step ST1, matches one of defective-memory-cell addresses being held by the defective-memory-cell address holding unit 8, the memory block advances to step ST8 in which it writes the write data into the redundant unit 2 and ends the write operation without performing a comparison operation by means of the comparator 7.

In accordance with the first embodiment, when an incoming address to which a write access is to be made matches one defective-memory-cell address being held by the defective-memory-cell address holding unit 8, a data read/write operation is carried out on the redundant unit 2, as previous mentioned. Accordingly, in this case, by stopping any operation of writing or reading data into or from the memory cell unit 1, power consumption can be reduced. In addition, since there is no need to perform a comparison operation by means of the comparator 7, power consumption can be further reduced.

As previously explained, in accordance with the first embodiment of the present invention, when the memory cell unit 1 has a defective part, the memory block enables the redundant unit 2 to take the place of the detective part to perform a function essentially provided by the detective part. Accordingly, the first embodiment makes it possible to make the semiconductor integrated circuit, which would be a defective piece if it has a defective part, available even if it has a defective part, thus improving yields. In addition, using the test port, the comparator 7, and the defective-memory-cell address holding unit 8, the memory block of the first embodiment can test any memory cell in question while the memory block is operating, and, if there is a defective memory cell, replace the defective part of the memory cell unit 1 with the redundant unit 2 via software. Accordingly, there is no need to test the semiconductor integrated circuit device before shipment to identify defective parts, and change all defective parts into hard-wired parts by laser trimming, thus reducing the cost of testing. Such a test is carried out in order to make a conventional semiconductor integrated circuit, which would be a defective piece if it has a defective part, available.

Since detection of a defective part is carried out by comparing write data with corresponding read data, determination of whether or not a memory cell is defective is dependent upon data stored in the memory cell. In other words, some data can make a defective memory cell look as if it functions normally. For example, when the memory cell unit has a defective memory cell that always outputs "0" and "0" is written into the memory cell, the redundant unit does not need to take the place of the defective memory cell. There is no need to store such data into the redundant unit 2, and therefore the storage amount of the redundant unit 2 can be reduced in consideration with the fact, thereby reducing the chip cost. In addition, there is no need to substitute the redundant unit 2 for not-yet-used addresses and the repair process using the redundant unit 2 is done only for actually-used addresses (or an actually-used region), thus decreasing the chip cost. Furthermore, after detection of a mismatch between write data associated with an address and read data, no further comparison is performed on any access to the address. Accordingly, the time required for a read/write operation can be reduced and the availability rate of the comparator 7 can be reduced, and therefore the power consumption can be reduced. Since the defective-memory-cell address holding unit 8 can furnish an overflow signal OVF when the memory cell unit 1 has many defective memory cells and the defective-memory-cell address holding unit 8 and the redundant unit 2 therefore cannot take the place of all defective memory cells of the memory cell unit, the memory block can perform an error process by notifying the system of a necessity to latch data, which is to be written into a defective part of the memory cell unit 1, to another memory, thus preventing the system from malfunctioning.

Embodiment 2

Figure 4:
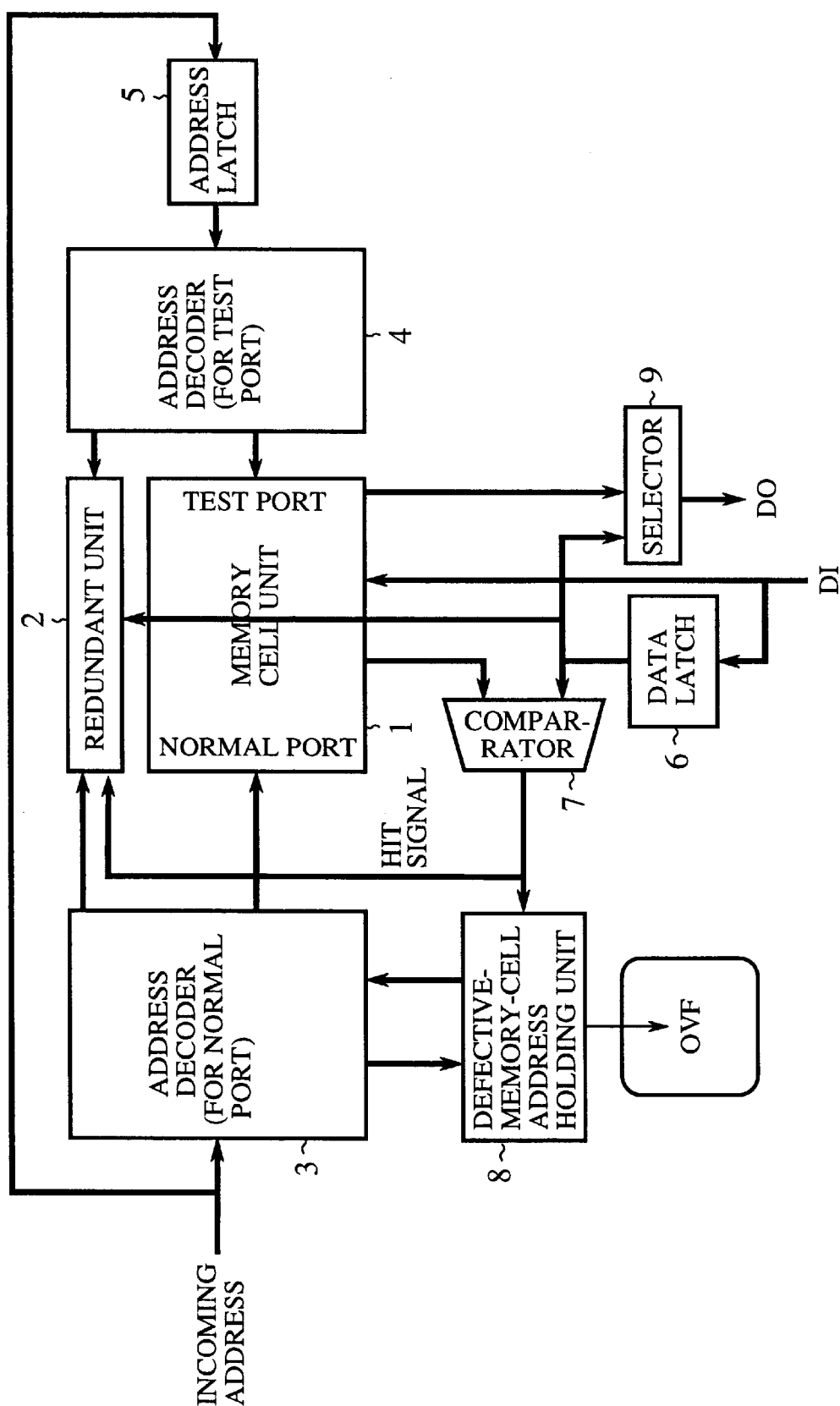
FIG. 4 is a block diagram showing the structure of a memory block mounted on a semiconductor integrated circuit device according to a second embodiment of the present invention.

Referring next to FIG. 4, there is illustrated a block diagram showing the structure of a memory block mounted on a semiconductor integrated circuit device according to a second embodiment of the present invention. In the figure, the same reference numerals as shown in FIG. 1 denote the same components as of the first embodiment or like components, and therefore the description of these components will be omitted hereinafter. The memory block of the second embodiment differs from that of the first embodiment as shown in FIG. 1 in that a data latch 6 consists of one latch.

Basically, the memory block according to the second embodiment operates in the same way that the memory block according to the first embodiment does, and only a difference between the first and second embodiments will be explained hereinafter. When a write operation is performed, incoming write data from a data input terminal DI is temporarily held by the data latch 6, and is also input to a memory cell unit 1 by way of a normal port. Then a comparator 7 compares the original write data latched by the data latch 6 with corresponding data read out of the memory cell unit 1 by way of the test port at the expiration of one clock cycle after the incoming address has been applied to a first address decoder 3, so as to determine whether they match. When the comparator 7 detects a mismatch between the write data latched by the data latch 6 and the corresponding data read out of the memory cell unit 1 by way of the test port, it furnishes a hit signal indicating a mismatch to both a defective-memory-cell address holding unit 8 and a redundant unit 2 to allow the defective-memory-cell address holding unit 8 to latch the incoming address applied to the first address decoder 3 as a defective-memory-cell address and to allow the redundant unit 2 to latch the write data held by the data latch 6.

Figure 5:
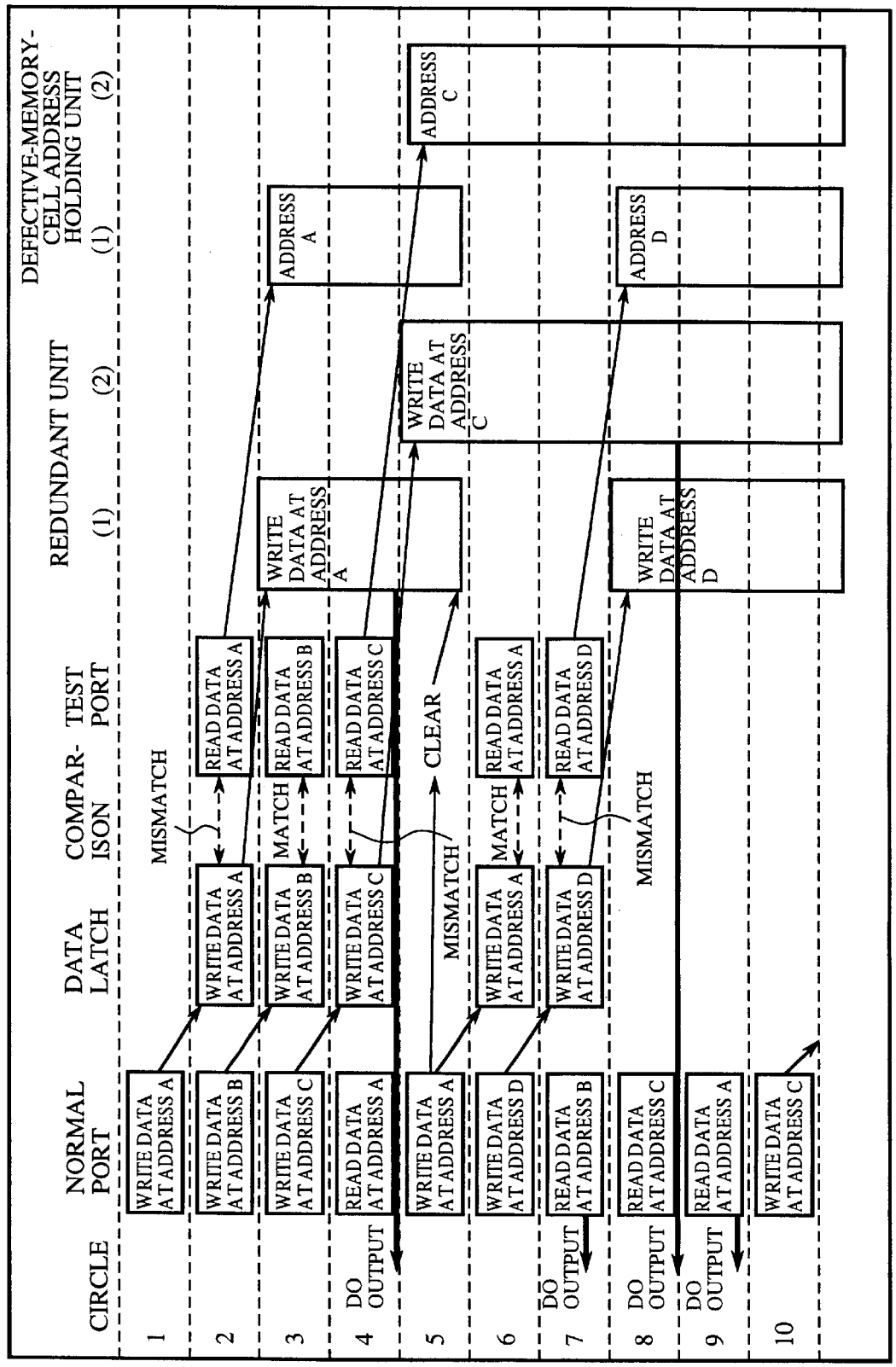
FIG. 5 is a diagram showing the operation of the memory block according to the second embodiment at every clock cycle.

Referring next to FIG. 5, there is illustrated a diagram showing the operation of the memory block according to the second embodiment at every clock cycle. For simplicity, in FIG. 5, it is assumed that the redundant unit 2 includes two memory cells, and the defective-memory-cell address holding unit 8 includes two address registers. Next, a description will be made as to the operation of the memory block with reference to FIG. 5.

In the first clock cycle, write data, which is to be written into a location at an address A of the memory cell unit 1, is applied to the normal port of the memory cell unit 1. Next, in the second clock cycle, the data latch 6 latches the write data written into the address A, which was applied to the normal port in the previous clock cycle (first clock cycle), and the comparator 7 then compares the write data latched by the data latch 6 with corresponding data read out of the address A of the memory cell unit 1 via the test port. When the comparator 7 detects a mismatch between them, it furnishes the hit signal to both the defective-memory-cell address holding unit 8 and the redundant unit 2. As a result, a first defective-memory-cell address register (1) of the address holding unit 8 latches the address A, and a first memory cell (1) of the redundant unit 2 latches the write data written into the address A, which is temporarily held by the data latch 6. In addition, other write data to be written into a location at an address B of the memory cell unit 1 is applied to the normal port in the second clock cycle.

In the third clock cycle, the data latch 6 latches the write data written into the address B, which was applied to the normal port in the previous clock cycle (or second clock cycle). The comparator 7 then compares the second write data written into the address B being held by the data latch 6 with corresponding data read out of the address B of the memory cell unit 1 via the test port. When the comparator 7 detects a match between them, it can determine that the second write data written into the address B can be read out of the memory cell unit 1 properly. Accordingly, when reading the data from the address B, the data written into the memory location at the address B of the memory cell unit 1 is actually read. In other words, the defective-memory-cell address holding unit 8 does not hold the address B and the redundant unit 2 does not hold the write data. In addition, other write data to be written into a location at an address C of the memory cell unit 1 is applied to the normal port in the third clock cycle.

In the fourth clock cycle, the data latch 6 latches the write data written into the address C, which was applied to the normal port in the previous clock cycle (or third clock cycle). The comparator 7 then compares the third write data written into the address C being held by the data latch 6 with corresponding data read out of the address C of the memory cell unit 1 via the test port. When the comparator 7 detects a mismatch between them, it furnishes the hit signal to both the defective-memory-cell address holding unit 8 and the redundant unit 2. As a result, a second defective-memory-cell address register (2) of the address holding unit 8 latches the address C, and a second memory cell (2) of the redundant unit 2 latches the write data written into the address C, which is temporarily held by the data latch 6. In addition, in the fourth clock cycle, an operation of reading the data from the address A is preformed by way of the normal port of the memory cell unit 1. Since the address A matches the address being held by the first defective-memory-cell address register (1), the selector 9 selects the data being held by the first memory cell (1) of the redundant unit 2 and then furnishes the data as the read data that assumes to be stored in the address A by way of the data output terminal DO.

Next, in the fifth clock cycle, a second operation of writing data into the address A is performed by way of the normal port of the memory cell unit 1. The address A is being held, as a defective-memory-cell address, by the first defective-memory-cell address register (1). The second operation of writing data into the address A, which is being held by the first defective-memory-cell address register (1), triggers clearing of the contents of the first defective-memory-cell address register (1), as well as the contents of first memory cell (1) of the redundant unit 2. As an alternative, they can be brought into a state in which they can be overwritten with new data.

In the sixth clock cycle, the data latch 6 latches the new write data written into the address A, which was applied to the normal port in the previous clock cycle (or fifth clock cycle). The comparator 7 then compares the new write data written into the address A, which is being held by the data latch 6, with corresponding data read out of the address A of the memory cell unit 1 via the test port. When the comparator 7 detects a match between them, it can determine that the data written into the address A can be read out of the memory cell unit 1 properly. Accordingly, when reading the data from the address A, the data written into the memory location at the address A of the memory cell unit 1 is actually read. In other words, the defective-memory-cell address holding unit 8 does not hold the address A and the redundant unit 2 does not hold the data. In addition, other write data to be written into a location at an address D of the memory cell unit 1 is applied to the normal port in the sixth clock cycle.

In the seventh clock cycle, the data latch 6 latches the write data written into the address D, which was applied to the normal port in the previous clock cycle (or sixth clock cycle). The comparator 7 then compares the original write data written into the address D, which is being held by the data latch 6, with corresponding data read out of the address D of the memory cell unit 1 via the test port. When the comparator 7 detects a mismatch between them, it furnishes the hit signal to both the defective-memory-cell address holding unit 8 and the redundant unit 2. As a result, the first defective-memory-cell address register (1) latches the address D, and the first memory cell (1) of the redundant unit 2 latches the write data written into the address D, which is temporarily held by the data latch 6. On the other hand, an operation of reading data from the address B is performed by way of the normal port of the memory cell unit 1 in the seventh clock cycle. In this case, since the defective-memory-cell address holding unit 8 is not holding the address B as a defective-memory-cell address, a normal read operation is carried out using the memory cell unit 1 and the data stored in the address B of the memory cell unit 1 is furnished as the read data by way of the data output terminal DO.

In the eighth clock cycle, an operation of reading data from the address C is performed by way of the normal port of the memory cell unit 1. Since the address C matches the address being held by the second defective-memory-cell address register (2), the write data being held by the second memory cell (2) of the redundant unit 2 is furnished, as the read data, by way of the data output terminal DO. In the ninth clock cycle, an operation of reading data from the address A is performed by way of the normal port of the memory cell unit 1. In this case, since the defective-memory-cell address holding unit 8 is not holding the address A as a defective-memory-cell address, a normal read operation is carried out using the memory cell unit 1 and the data stored in the address A of the memory cell unit 1 is furnished as the read data by way of the data output terminal DO.

In the tenth clock cycle, a second operation of writing data into the address C is performed by way of the normal port of the memory cell unit 1. Since the address C matches the address being held by the second defective-memory-cell address register (2), the memory block according to the second embodiment clears the contents of the second defective-memory-cell address register (2), as well as the contents of the second memory cell (2) of the redundant unit 2. As an alternative, they can be brought into a state in which they can be overwritten with new data. In the next clock cycle (or eleventh clock cycle), the comparator 7 compares the new write data written into the address C, which is being held by the data latch 6, with corresponding data read out of the address C of the memory cell unit 1 via the test port.

Figure 6:
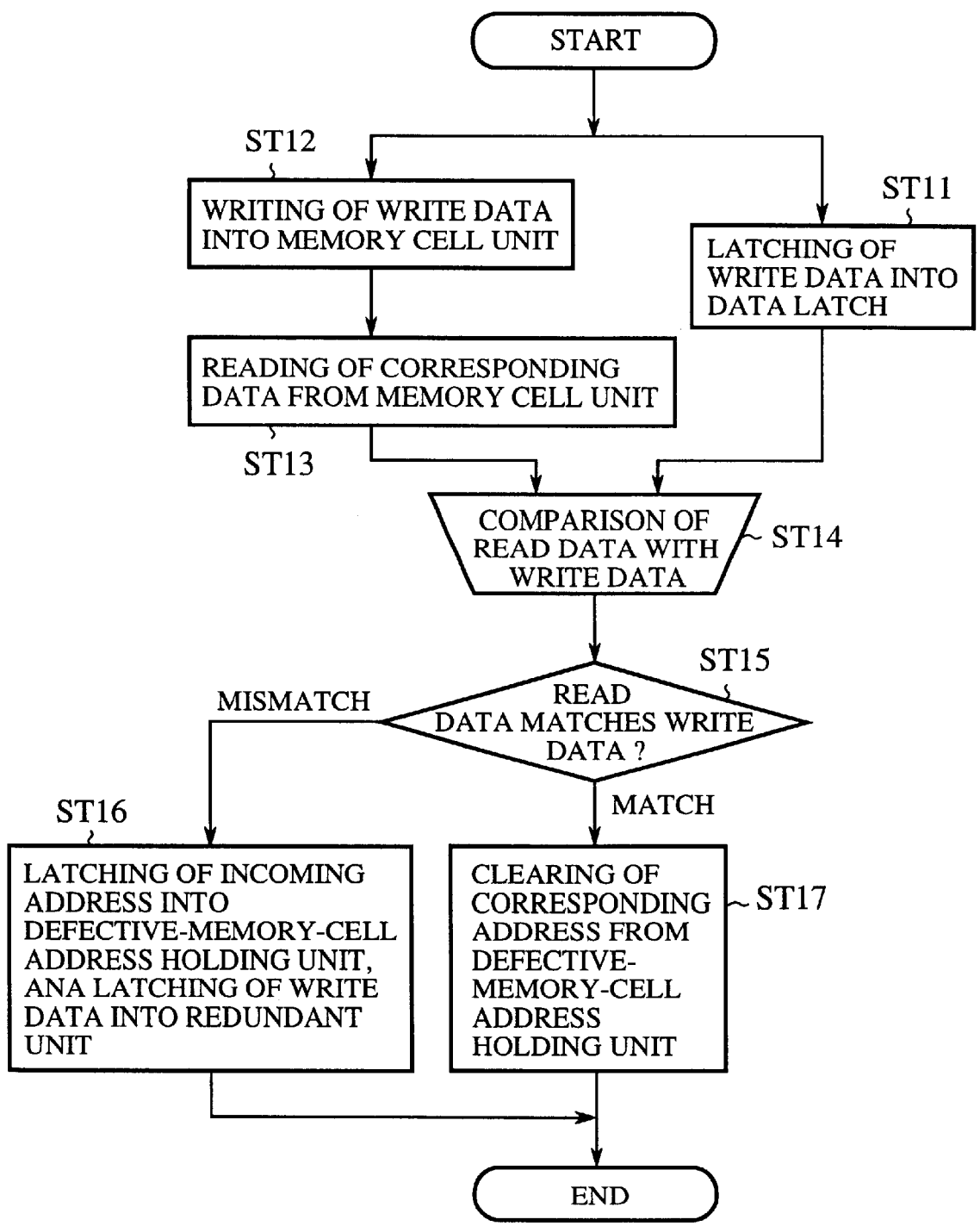
FIG. 6 is a flow diagram showing a procedure of writing data into the memory block according to the second embodiment.

Referring next to FIG. 6, there is illustrated a flow diagram showing a procedure of writing data into the memory block as shown in FIG. 5. Next, a description will be made as to the writing procedure with reference to FIG. 6.

When performing a write operation, the memory block, in step ST11, latches write data into the data latch 6. The memory block then, in step ST12, writes the write data into a location at an incoming address of the memory cell unit 1 by way of the normal port. After that, the memory block, in step ST13, reads corresponding data from the memory cell unit 1 by way of the test port. The comparator then, in step ST14, compares the original write data latched by the data latch 6 with the corresponding data read out of the memory cell unit 1 via the test port in step ST13, and, in step ST15, determines if they match. As a result, when the comparator 7 determines that they don't match, it furnishes the hit signal to both the defective-memory-cell address holding unit 8 and the redundant unit 2, so that the memory block advances to step ST16 in which it enables the defective-memory-cell address holding unit 8 to latch the address as a defective-memory-cell address and it also enables the redundant unit 2 to latch the write data. The memory block then ends the write operation. In contrast, when there is a match between the write data latched by the data latch 6 with the data read out of the memory cell unit 1 via the test port in step ST13, the memory block advances to step ST17 in which if one address register of the defective-memory-cell address holding unit 8 is holding the address applied to the first address decoder 3, it clears the contents of the defective-memory-cell address register or brings the defective-memory-cell address register into a state in witch it can be overwritten with new data and then ends the write operation.

As can be seen from the above description, the second embodiment of the present invention offers the same advantages as provided by the aforementioned first embodiment. That is, the second embodiment makes it possible to make the semiconductor integrated circuit device available even if it has a defective part, thus improving yields. In addition, the memory block of the second embodiment can test any memory cell in question while the memory block is operating, and, if there is a defective memory cell, substitute the redundant unit 2 for the defective part of the memory cell unit 1 using software, thereby reducing the cost of testing. Furthermore, the storage amount of the redundant unit 2 can be reduced in consideration with the fact that some data can make a defective memory cell look as if it functions normally. Also, since there is no need to substitute the redundant unit 2 for not-yet-used addresses, the chip cost can be reduced. Since the defective-memory-cell address holding unit 8 can furnish an overflow signal OVF when the memory cell unit 1 has many defective memory cells and the defective-memory-cell address holding unit 8 and the redundant unit 2 therefore cannot take the place of all defective memory cells of the memory cell unit, the memory block can perform an error process by notifying the system of a necessity to latch data, which is to be written into a defective part of the memory cell unit 1, to another memory, thus preventing the system from malfunctioning.

In addition, the second embodiment offers the advantage of being able to scale down the semiconductor integrated circuit device and hence reduce the chip cost, because every time a write operation is performed, the comparator 7 performs a comparison between original write data latched by the data latch 6 and read data, and the write data is also transferred to the redundant unit 2 when the comparator 7 detects a mismatch between them, and therefore the memory block does not need a plurality of latches within the data latch 6. Furthermore, when the comparator determines that a write access to an address in which a mismatch has already been found is made properly and the data written into the address is assumed to be correct, the memory block can free up a corresponding memory cell of the redundant unit 2. Accordingly, the memory block can effectively use the redundant unit 2 with a small storage amount to repair more defective parts of the memory cell unit, thus reducing the chip cost.

Embodiment 3

Figure 7:
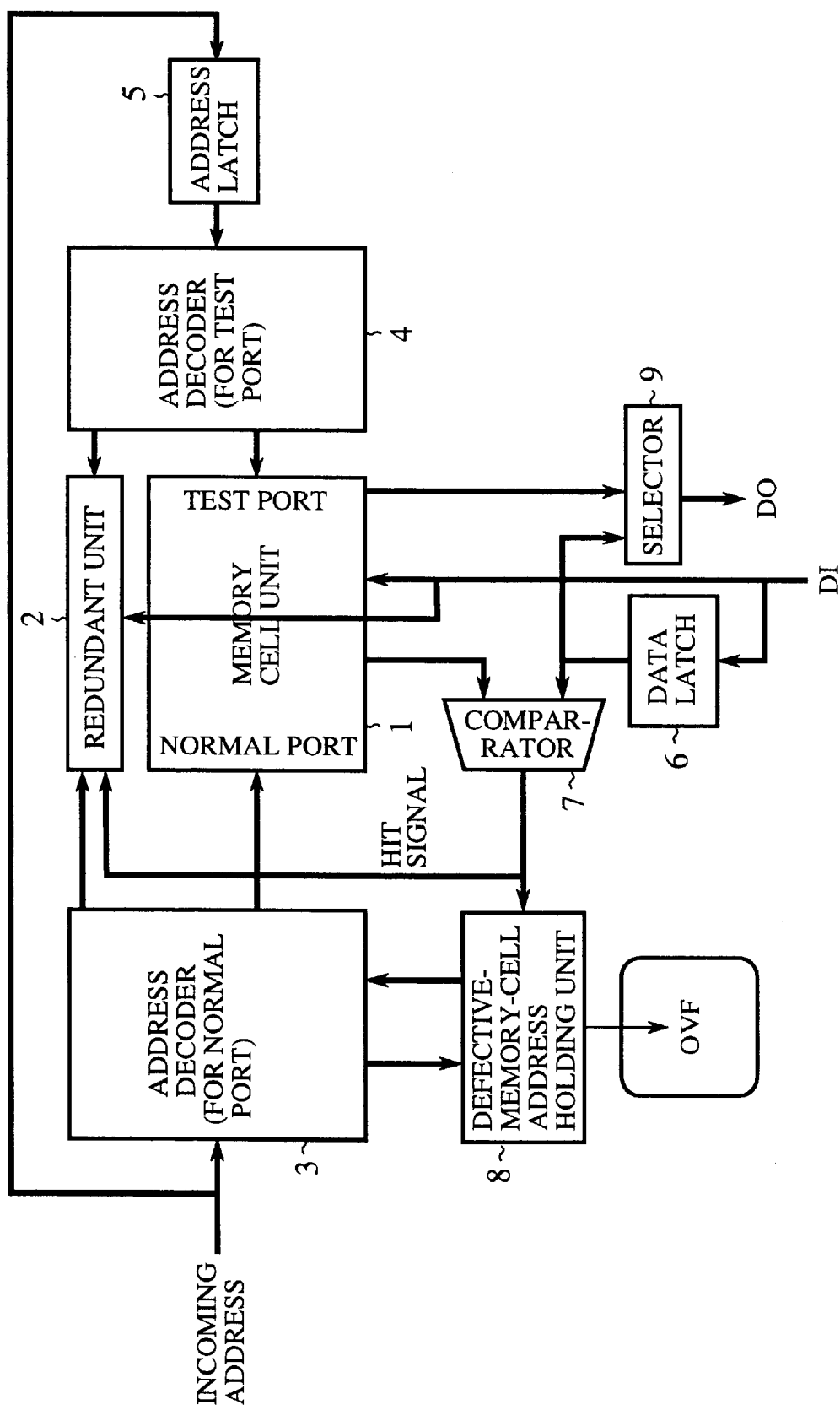
FIG. 7 is a block diagram showing the structure of a memory block mounted on a semiconductor integrated circuit device according to a third embodiment of the present invention.

Referring next to FIG. 7, there is illustrated a block diagram showing the structure of a memory block mounted on a semiconductor integrated circuit device according to a third embodiment of the present invention. In the figure, the same reference numerals as shown in FIG. 4 denote the same components as of the second embodiment or like components, and therefore the description of these components will be omitted hereinafter. The memory block of the third embodiment differs from that of the second embodiment as shown in FIG. 4 in that when performing a write operation write data input from a data input terminal DI is simultaneously latched into a data latch 6 and a redundant unit 2.

Basically, the memory block according to the third embodiment operates in the same way that the memory block according to the first embodiment does, and only a difference between the first and third embodiments will be explained hereinafter. When a write operation is performed, incoming write data from the data input terminal DI is temporarily held by the data latch 6, and is also input to both a normal port of a memory cell unit 1 and the redundant unit 2. In addition, a defective-memory-cell address holding unit 8 latches an incoming address identifying a location of the memory cell unit 1 where the write data has been stored, as a defective-memory-cell address. Then a comparator 7 compares the original write data latched by the data latch 6 with corresponding data read out of the memory cell unit 1 by way of the test port at the expiration of one clock cycle after the incoming address has been applied to a first address decoder 3, so as to determine whether they match. When the comparator 7 detects a mismatch between the write data latched by the data latch 6 and the corresponding data read out of the memory cell unit 1 by way of the test port, it furnishes a hit signal indicating the mismatch to both the defective-memory-cell address holding unit 8 and the redundant unit 2 to allow the defective-memory-cell address holding unit 8 to keep holding the incoming address and to allow the redundant unit 2 to keep holding the write data.

Figure 8:
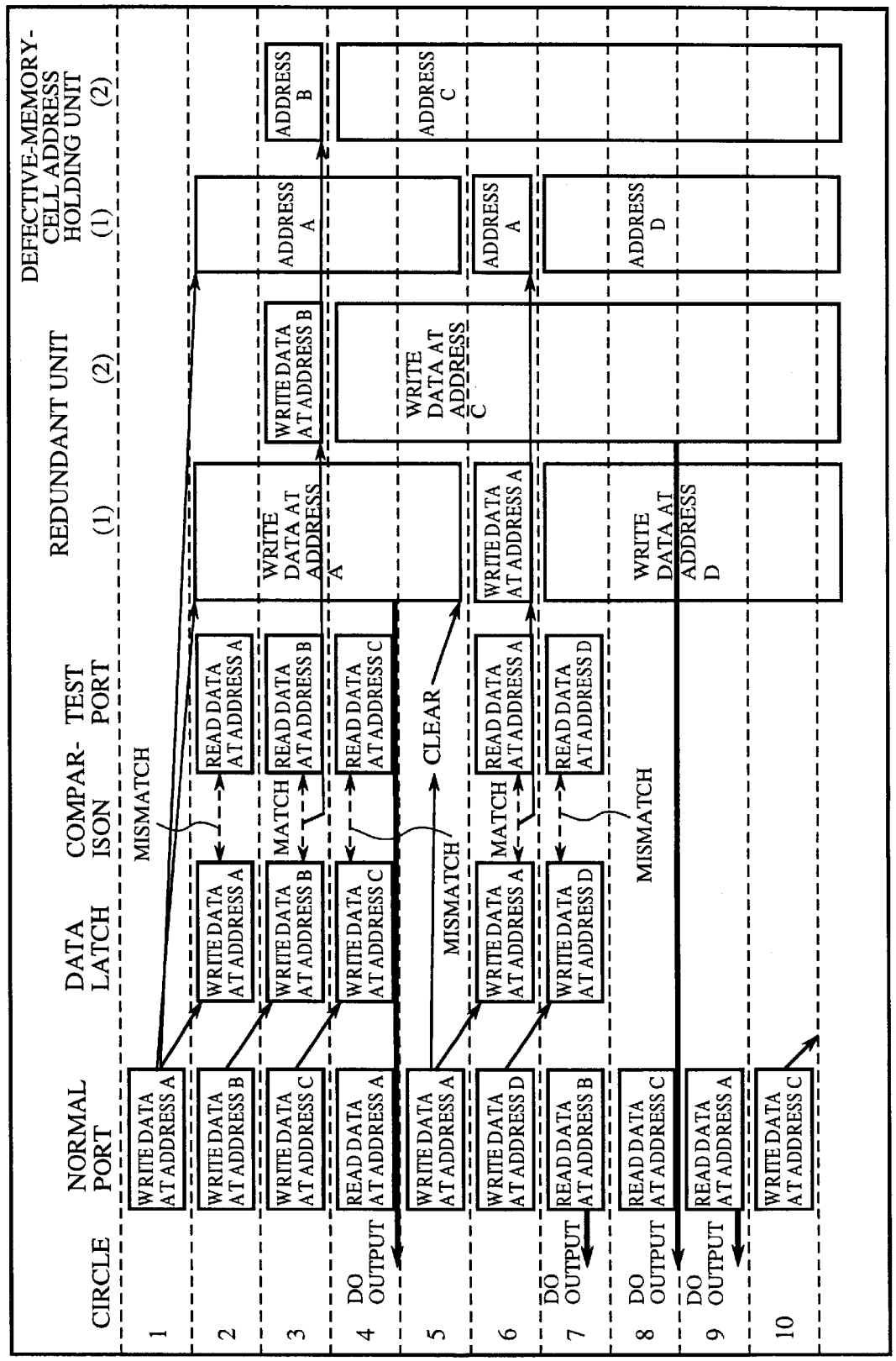
FIG. 8 is a diagram showing the operation of the memory block according to the third embodiment at every clock cycle.

Referring next to FIG. 8, there is illustrated a diagram showing the operation of the memory block according to the third embodiment at every clock cycle. For simplicity, in FIG. 8, it is assumed that the redundant unit 2 includes two memory cells, and the defective-memory-cell address holding unit 8 includes two address registers. Next, a description will be made as to the operation of the memory block with reference to FIG. 8.

In the first clock cycle, write data, which is to be written into a location at an address A of the memory cell unit 1, is applied to the normal port of the memory cell unit 1. Next, in the second clock cycle, the data latch 6 latches the write data written into the address A, which was applied to the normal port in the previous clock cycle (first clock cycle), and a first memory cell (1) of the redundant unit 2 also latches the write data. Further, a first defective-memory-cell address register (1) latches the address A. The comparator 7 then compares the write data latched by the data latch 6 with corresponding data read out of the address A of the memory cell unit 1 via the test port. When the comparator 7 detects a mismatch between them, it furnishes the hit signal to both the defective-memory-cell address holding unit 8 and the redundant unit 2. As a result, the first memory cell (1) of the redundant unit 2 keeps holding the write data which has already been latched thereinto, and the first defective-memory-cell address register (1) of the address holding unit 8 keeps holding the address A which has already been latched thereinto. In addition, other write data to be written into a location at an address B of the memory cell unit 1 is applied to the normal port in the second clock cycle.

In the third clock cycle, the data latch 6 latches the write data written into the address B, which was applied to the normal port in the previous clock cycle (or second clock cycle), and a second memory cell (2) of the redundant unit 2 also latches the write data. Further, a second defective-memory-cell address register (2) latches the address B. The comparator 7 then compares the second write data written into the address B being held by the data latch 6 with corresponding data read out of the address B of the memory cell unit 1 via the test port. When the comparator 7 detects a match between them, it can determine that the second write data written into the address B can be read out of the memory cell unit 1 properly. Accordingly, when reading the data from the address B, the data written into the memory location at the address B of the memory cell unit 1 is actually read. The write data is then cleared from the second memory cell (2) of the redundant unit 2. Alternatively, the second memory cell (2) of the redundant unit 2 can be brought into a state in which it can be overwritten with new data. Similarly, the address B is cleared from the second defective-memory-cell address register (2), or the second defective-memory-cell address register (2) is alternatively brought into a state in which it can be overwritten with new data. In addition, other write data to be written into a location at an address C of the memory cell unit 1 is applied to the normal port in the third clock cycle.

In the fourth clock cycle, the data latch 6 latches the write data written into the address C, which was applied to the normal port in the previous clock cycle (or third clock cycle). The second memory cell (2) of the redundant unit 2 also latches the write data. Further, the second defective-memory-cell address register (2) latches the address C. The comparator 7 then compares the third write data written into the address C being held by the data latch 6 with corresponding data read out of the address C of the memory cell unit 1 via the test port. When the comparator 7 detects a mismatch between them, it furnishes the hit signal to both the defective-memory-cell address holding unit 8 and the redundant unit 2. As a result, the second memory cell (2) of the redundant unit 2 keeps holding the write data which has already been latched thereinto, and the second defective-memory-cell address register (2) of the address holding unit 8 keeps holding the address C which has already been latched thereinto. In addition, in the fourth clock cycle, an operation of reading the data from the address A is preformed by way of the normal port of the memory cell unit 1. Since the address A matches the address being held by the first defective-memory-cell address register (1), the selector 9 selects the data being held by the first memory cell (1) of the redundant unit 2 and then furnishes the data as the read data that assumes to be stored in the address A by way of the data output terminal DO.

Next, in the fifth clock cycle, a second operation of writing data into the address A is performed by way of the normal port of the memory cell unit 1. The address A is being held, as a defective-memory-cell address, by the first defective-memory-cell address register (1). The second operation of writing data into the address A, which is being held by the first defective-memory-cell address register (1), triggers clearing of the contents of the first defective-memory-cell address register (1), as well as the contents of first memory cell (1) of the redundant unit 2. As an alternative, they can be brought into a state in which they can be overwritten with new data.

In the sixth clock cycle, the data latch 6 latches the new write data written into the address A, which was applied to the normal port in the previous clock cycle (or fifth clock cycle). The first memory cell (1) of the redundant unit 2 also latches the write data. Further, the first defective-memory-cell address register (1) latches the address A. The comparator 7 then compares the new write data written into the address A, which is being held by the data latch 6, with corresponding data read out of the address A of the memory cell unit 1 via the test port. If the comparator 7 detects a match between them, it can determine that the data written into the address A can be read out of the memory cell unit 1 properly. Accordingly, when reading the data from the address A, the data written into the memory location at the address A of the memory cell unit 1 is actually read. The write data associated with the address A is then cleared from the first memory cell (1) of the redundant unit 2. Alternatively, the first memory cell (1) of the redundant unit 2 can be brought into a state in which it can be overwritten with new data. Similarly, the address A is cleared from the first defective-memory-cell address register (1), or the first defective-memory-cell address register (1) is alternatively brought into a state in which it can be overwritten with new data. In addition, other write data to be written into a location at an address D of the memory cell unit 1 is applied to the normal port in the sixth clock cycle.

In the seventh clock cycle, the data latch 6 latches the write data written into the address D, which was applied to the normal port in the previous clock cycle (or sixth clock cycle). The first memory cell (1) of the redundant unit 2 also latches the write data. Further, the first defective-memory-cell address register (1) latches the address D. The comparator 7 then compares the original write data written into the address D, which is being held by the data latch 6, with corresponding data read out of the address D of the memory cell unit 1 via the test port. When the comparator 7 detects a mismatch between them, it furnishes the hit signal to both the defective-memory-cell address holding unit 8 and the redundant unit 2. As a result, the first memory cell (1) of the redundant unit 2 keeps holding the write data which has already been latched thereinto, and the first defective-memory-cell address register (1) of the address holding unit 8 keeps holding the address D which has already been latched thereinto. On the other hand, an operation of reading data from the address B is performed by way of the normal port of the memory cell unit 1 in the seventh clock cycle. In this case, since the defective-memory-cell address holding unit 8 is not holding the address B as a defective-memory-cell address, a normal read operation is carried out using the memory cell unit 1 and the data stored in the address B of the memory cell unit 1 is furnished as the read data by way of the data output terminal DO.

In the eighth clock cycle, an operation of reading data from the address C is performed by way of the normal port of the memory cell unit 1. Since the address C matches the address being held by the second defective-memory-cell address register (2), the write data being held by the second memory cell (2) of the redundant unit 2 is furnished, as the read data, by way of the data output terminal DO. In the ninth clock cycle, an operation of reading data from the address A is performed by way of the normal port of the memory cell unit 1. In this case, since the defective-memory-cell address holding unit 8 is not holding the address A as a defective-memory-cell address, a normal read operation is carried out using the memory cell unit 1 and the data stored in the address A of the memory cell unit 1 is furnished as the read data by way of the data output terminal DO.

In the tenth clock cycle, a second operation of writing data into the address C is performed by way of the normal port of the memory cell unit 1. Since the address C matches the address being held by the second defective-memory-cell address register (2), the memory block according to the third embodiment clears the contents of the second defective-memory-cell address register (2), as well as the contents of the second memory cell (2) of the redundant unit 2. As an alternative, they can be brought into a state in which they can be overwritten with new data. In the next clock cycle (or eleventh clock cycle), the comparator 7 compares the new write data written into the address C, which is being held by the data latch 6, with corresponding data read out of the address C of the memory cell unit 1 via the test port.

Figure 9:
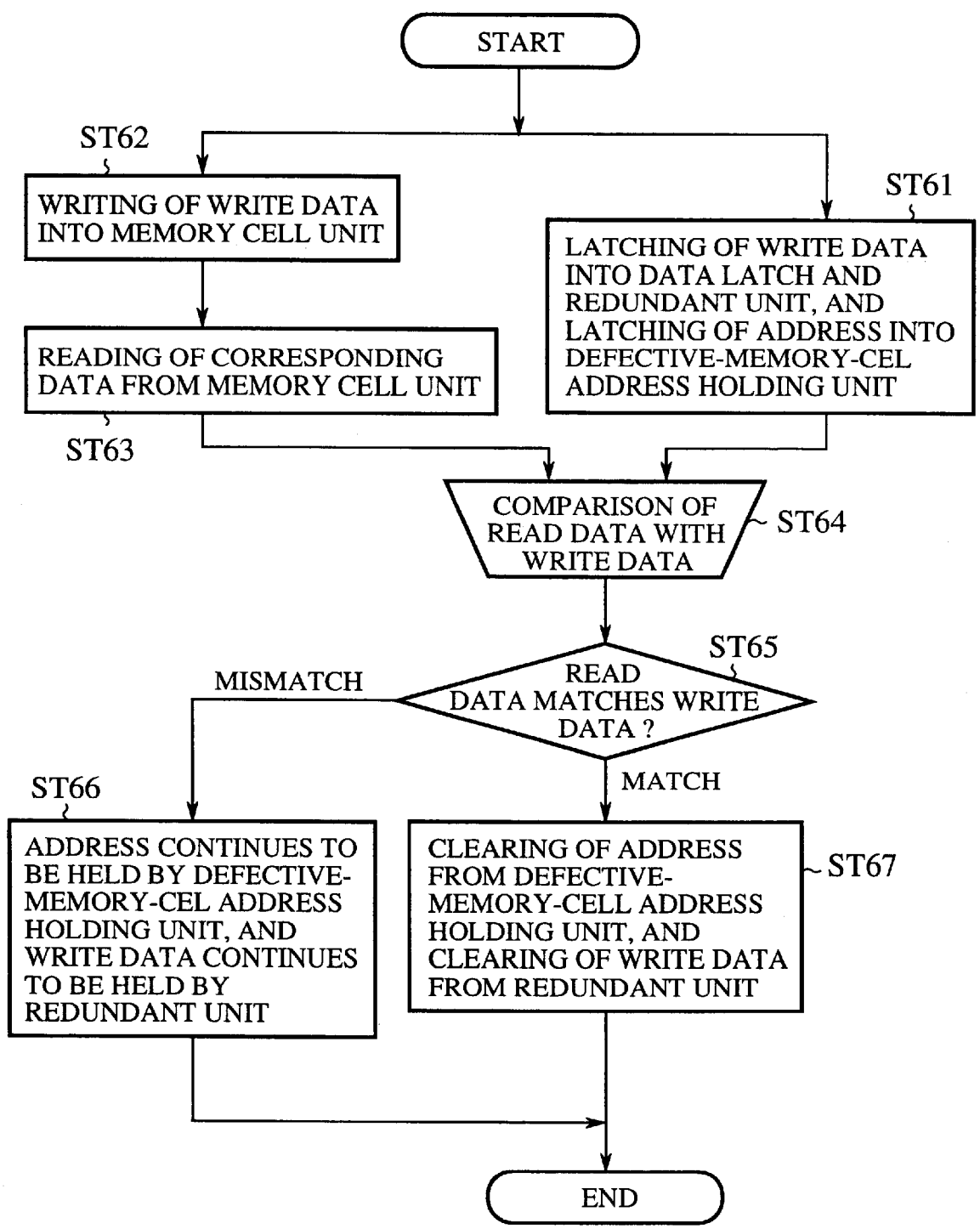
FIG. 9 is a flow diagram showing a procedure of writing data into the memory block according to the third embodiment.

Referring next to FIG. 9, there is illustrated a flow diagram showing a procedure of writing data into the memory block as shown in FIG. 8. Next, a description will be made as to the writing procedure with reference to FIG. 9.

When performing a write operation, the memory block, in step ST61, enables the data latch 6 to latch write data and also enables the redundant unit 2 to latch the write data. Further, the defective-memory-cell address holding unit 8 latches an incoming address identifying a location where the write data is to be stored in the memory cell unit 1, as a defective-memory-cell address. The memory block then, in step ST62, writes the write data into the location at the incoming address of the memory cell unit 1 by way of the normal port. After that, the memory block, in step ST63, reads corresponding data from the memory cell unit 1 by way of the test port. The comparator then, in step ST64, compares the original write data latched by the data latch 6 with the corresponding data read out of the memory cell unit 1 via the test port in step ST63, and, in step ST65, determines if they match. As a result, when the comparator 7 determines that they don't match, it furnishes the hit signal to both the defective-memory-cell address holding unit 8 and the redundant unit 2, so that the memory block advances to step ST66 in which it enables the defective-memory-cell address holding unit 8 to keep holding the incoming address as a defective-memory-cell address and it also enables the redundant unit 2 to keep holding the write data. The memory block then ends the write operation. In contrast, when there is a match between the write data latched by the data latch 6 with the data read out of the memory cell unit 1 via the test port in step ST63, the memory block advances to step ST67 in which it clears the contents of a memory cell of the redundant unit 2 holding the write data or brings the memory cell into a state in witch it can be overwritten with new data. The memory block further clears the contents of a defective-memory-cell address register holding the incoming address or brings the defective-memory-cell address register into a state in witch it can be overwritten with new data. The memory block then ends the write operation.

As can be seen from the above description, the third embodiment of the present invention offers the same advantages as provided by the aforementioned first embodiment. That is, the third embodiment makes it possible to make the semiconductor integrated circuit device available even if it has a defective part, thus improving yields. In addition, the memory block of the third embodiment can test any memory cell in question while the memory block is operating, and, if there is a defective memory cell, substitute the redundant unit 2 for the defective part of the memory cell unit 1 using software, thereby reducing the cost of testing. Furthermore, the storage amount of the redundant unit 2 can be reduced in consideration with the fact that some data can make a defective memory cell look as if it functions normally. Also, since there is no need to substitute the redundant unit 2 for not-yet-used addresses, the chip cost can be reduced. Since the defective-memory-cell address holding unit 8 can furnish an overflow signal OVF when the memory cell unit 1 has many defective memory cells and the defective-memory-cell address holding unit 8 and the redundant unit 2 therefore cannot take the place of all defective memory cells of the memory cell unit, the memory block can perform an error process by notifying the system of a necessity to latch data, which is to be written into a defective part of the memory cell unit 1, into another memory, thus preventing the system from malfunctioning.

In addition, the third embodiment offers the advantage of being able to scale down the semiconductor integrated circuit device and hence reduce the chip cost, because every time a write operation is performed, the write data is transferred to the redundant unit 2 and therefore the memory block does not need a plurality of latches within the data latch 6. Furthermore, when the comparator determines that a write access to an address in which a mismatch has already been found is made properly and the data written into the address is assumed to be correct, the memory block can free up a corresponding memory cell of the redundant unit 2. Accordingly, the memory block can effectively use the redundant unit 2 with a small storage amount to repair more defective parts of the memory cell unit, thus reducing the chip cost.

Embodiment 4

Figure 10:
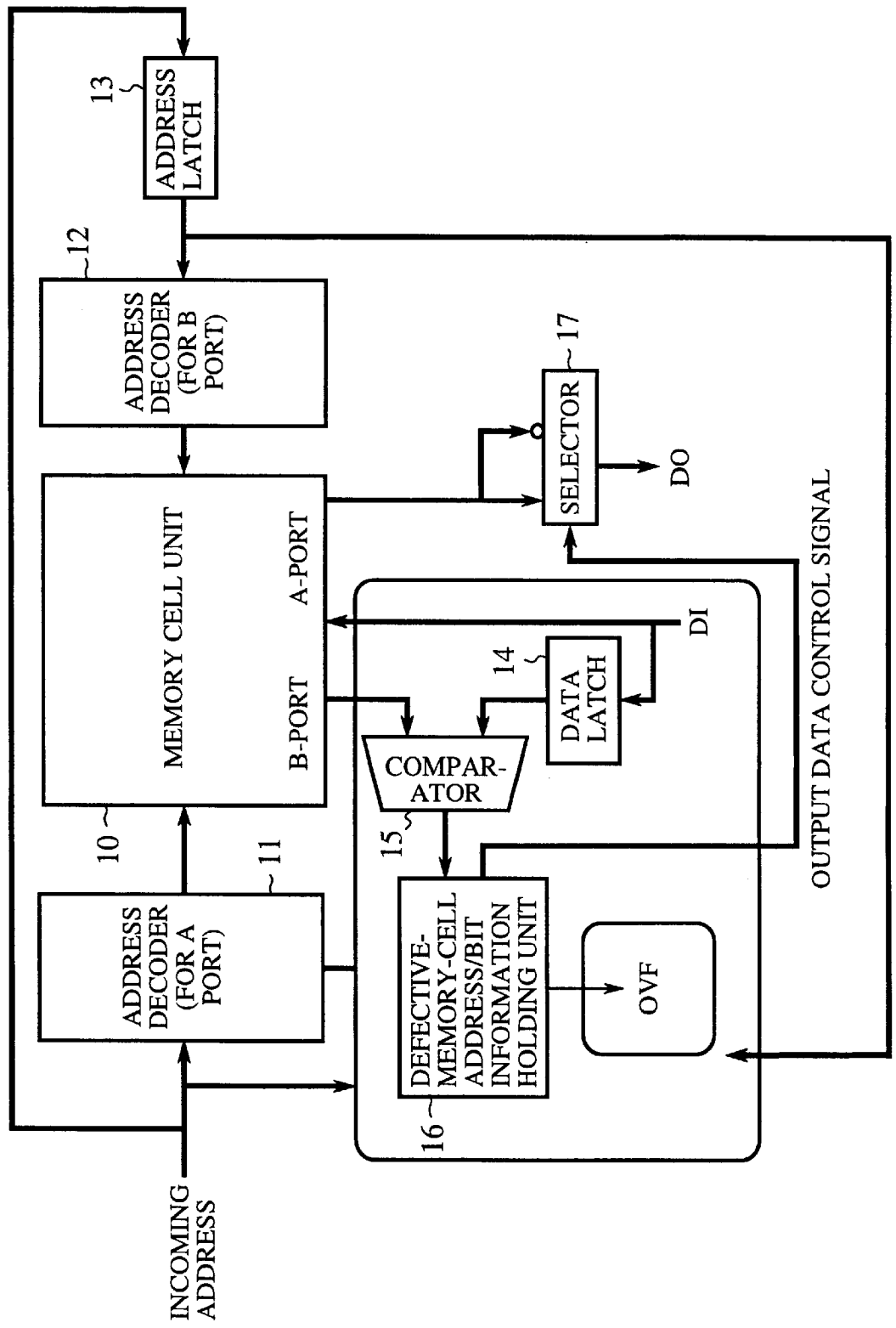
FIG. 10 is a block diagram showing the structure of a memory block mounted on a semiconductor integrated circuit device according to a fourth embodiment of the present invention.

Referring next to FIG. 10, there is illustrated a block diagram showing the structure of a memory block mounted on a semiconductor integrated circuit device according to a fourth embodiment of the present invention. In the figure, reference numeral 10 denotes a random access memory cell unit having a plurality of ports including a read port that serves as a test port. The memory cell unit 10 as shown in FIG. 10 has an A port that serves as a read/write port (or normal port) intended for normal read/write operations, and a B port that serves as a test port intended for tests. Reference numeral 11 denotes a first address decoder intended for the A port of the memory cell unit 10, numeral 12 denotes a second address decoder intended for the B port of the memory cell unit 10, and numeral 13 denotes an address latch for temporarily holding an address applied to the second address decoder 12.

Reference numeral 14 denotes a data latch for temporarily holding incoming data (or write data) from a data input terminal DI, numeral 15 denotes a comparator for comparing the write data latched by the data latch 14 with corresponding data read out of the B port (i.e., test port) of the memory cell unit 10 at the expiration of one clock cycle after an incoming address has been applied to the first address decoder 11, and numeral 16 denotes a defective-memory-cell address/bit information holding unit for holding the incoming address and bit information about one or more bits of the write data in which a mismatch between the write data latched by the data latch 14 and the corresponding data read out of the test port of the memory cell unit 10 has already been found by the comparator 15, and for generating an output data control signal based on the information stored therein when a read access to the address stored therein is made. When the defective-memory-cell address/bit information holding unit 16 cannot serve its essential function using a number of prepared address registers because the memory cell unit 10 has many defective parts, the defective-memory-cell address/bit information holding unit 16 generates an overflow signal OVF. Reference numeral 17 denotes a selector for furnishing data read out of the A (or normal) port of the memory cell unit 10 by way of a data output terminal DO, just as it is, or inverting one or more defective bits of the data read out of the memory cell unit 10 so as to correct the read data and furnishing the partially-inverted (or corrected) data by way of the data output terminal DO, according to the output data control signal from the defective-memory-cell address/bit information holding unit 16.

In operation, an incoming address is directly applied to the first address decoder 11 and is also input to the address latch 13 located at the front of the second address decoder 12, so that the address latch 13 can temporarily hold the incoming address. Accordingly, in the normal port write access, corresponding data is read out of the memory cell unit 10 via the test port at the expiration of one clock cycle after the incoming address has been applied to the first address decoder 11. Since the successive read operation via the test port is thus carried out in the next clock cycle of the normal port write access, the test port address decoding operation using the second address decoder 12 can be performed only after the normal port write operation has been done, and the address latch 13 can perform the address latching operation only in the next clock cycle of the normal port write operation.

Like the first embodiment, incoming data from the data input terminal DI is temporarily held by the data latch 14, and is also input, as write data, to the memory cell unit 10 by way of the normal port. Then the comparator 15 compares the original write data latched by the data latch 14 with corresponding data read out of the memory cell unit 10 by way of the test port at the expiration of one clock cycle after the incoming address has been applied to the first address decoder, so as to determine whether they match. If they match, it can be determined that the write/read accesses to the address of the memory cell unit 10 have been made properly. After that, when a read access to the address is made, the selector 17 selects data read out of a location at the address of the memory cell unit 10 and then furnishes the selected data by way of the data output terminal DO, just as it is.

In contrast, when the comparator 15 detects a mismatch between the write data latched by the data latch 14 and the data read out of the memory cell unit 10 by way of the test port, it can determine that the memory cell unit 10 has a defective memory cell at the address and allow the defective-memory-cell address/bit information holding unit 16 to latch and hold the address and information about one or more bits of the write data in which a mismatch has been found by the comparator. After that, when a read access to the address is made, the selector 17 partially inverts data read out of the address of the memory cell unit 10 according to the output data control signal which the defective-memory-cell address/bit information holding unit 16 generates based on the bit information stored therein and then furnishes the partially-inverted data by way of the data output terminal DO.

When the defective-memory-cell address/bit information holding unit 16 cannot serve its essential function by means of a number of address registers located therein because the memory cell unit 10 has many defective parts, it generates an overflow signal OVF so as to notify the system or semiconductor integrated circuit device of the occurrence of a memory failure.

Next, a description will be made as to an operation of generating the output data control signal, which is performed by the defective-memory-cell address/bit information holding unit 16.

Figure 11:
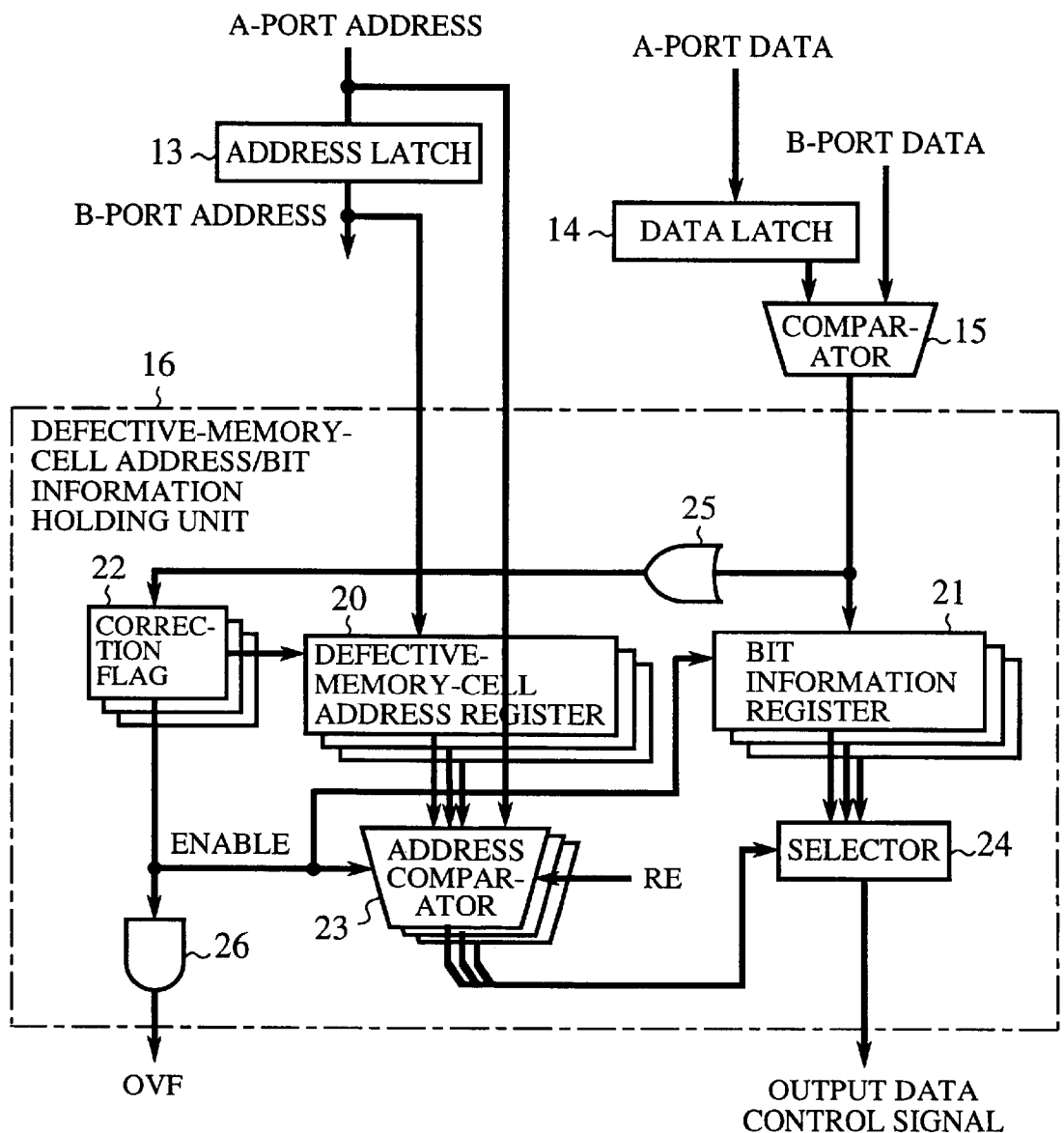
FIG. 11 is a block diagram showing the internal structure of a defective-memory-cell address/bit information holding unit of the memory block according to the fourth embodiment.

Referring next to FIG. 11, there is illustrated a block diagram showing the internal structure of the defective-memory-cell address/bit information holding unit 16. In the figure, reference numeral 20 denotes each of a plurality of defective-memory-cell address registers for storing a B-port address when the comparator 15 detects a mismatch between write data associated with the B-port address and corresponding data read out of a memory location at the B-port address of the memory cell unit 10, numeral 21 denotes each of a plurality of bit information registers, the number of which is equal to the number of the plural defective-memory-cell address registers 20, for storing bit information about one or more bits of the write data in which a mismatch has been found by the comparator 15, numeral 22 denotes each of a plurality of correction flags, the number of which is equal to the number of the defective-memory-cell address registers 20, one of the plurality of correction flags being set when the comparator 15 finds a mismatch and a B-port address is stored in a corresponding one of the plurality of defective-memory-cell address registers 20, numeral 23 denotes each of a plurality of address comparators, the number of which is equal to the number of the plural defective-memory-cell address registers 20, for comparing an A-port address with a corresponding address stored in each of the plurality of defective-memory-cell address registers 20 when performing an operation of reading data from the memory cell unit 10, numeral 24 denotes a selector for selecting one of the plurality of bit information registers 21 based on the comparison results from the plurality of address comparators 23, and for generating an output data control signal according to the bit information stored in the selected data register, numeral 25 denotes an OR gate for implementing a logical OR operation on signals from the comparator 15, each signal indicating whether each of all bits of the write data latched by the data latch 14 match each bit of the B-port data, and for furnishing the operation result to the plurality of correction flags 22, and numeral 26 denotes an AND gate for implementing a logical AND operation on outputs of the plurality of correction flags 22, and for furnishing the operation result as the overflow signal OVF.

As previously explained, the data latch 14 temporarily latches incoming write data applied to the normal port (or A port) of the memory cell unit 10, and the comparator 15 compares the original write data latched by the data latch 14 with corresponding data read out of the memory cell unit 10 via the test port (or B port) in the next clock cycle of the write operation. As a result, when the comparator 15 detects a mismatch between one or more bits of the write data and one or more corresponding bits of the read data, the defective-memory-cell address/bit information holding unit 16 sets one correction flag 22 and stores the address applied to the A-port address decoder in the previous clock cycle, i.e., the B-port address temporarily latched by the address latch 13, as a defective-memory-cell address, in a corresponding defective-memory-cell address register 20. The defective-memory-cell address/bit information holding unit 16 also stores the bit information about one or more bits of the write data in which a mismatch has been found by the comparator 15 in a corresponding correction data register 21.

After that, when a read operation is performed by way of the normal port, each of the plurality of address comparators 23 compares the A-port address associated with the read operation with each of the plurality of defective-memory-cell addresses stored in the plurality of defective-memory-cell address registers 20. If one of the plurality of address comparators 23 detects a match between the A-port address and a defective-memory-cell address stored in one defective-memory-cell address register 20, it controls the selector 24 so that the selector 24 selects a defective-memory-cell data register 21 corresponding to this defective-memory-cell address register 20 and furnishes the correction data stored in the selected defective-memory-cell data register 21 as the output data control signal.

Figure 12:
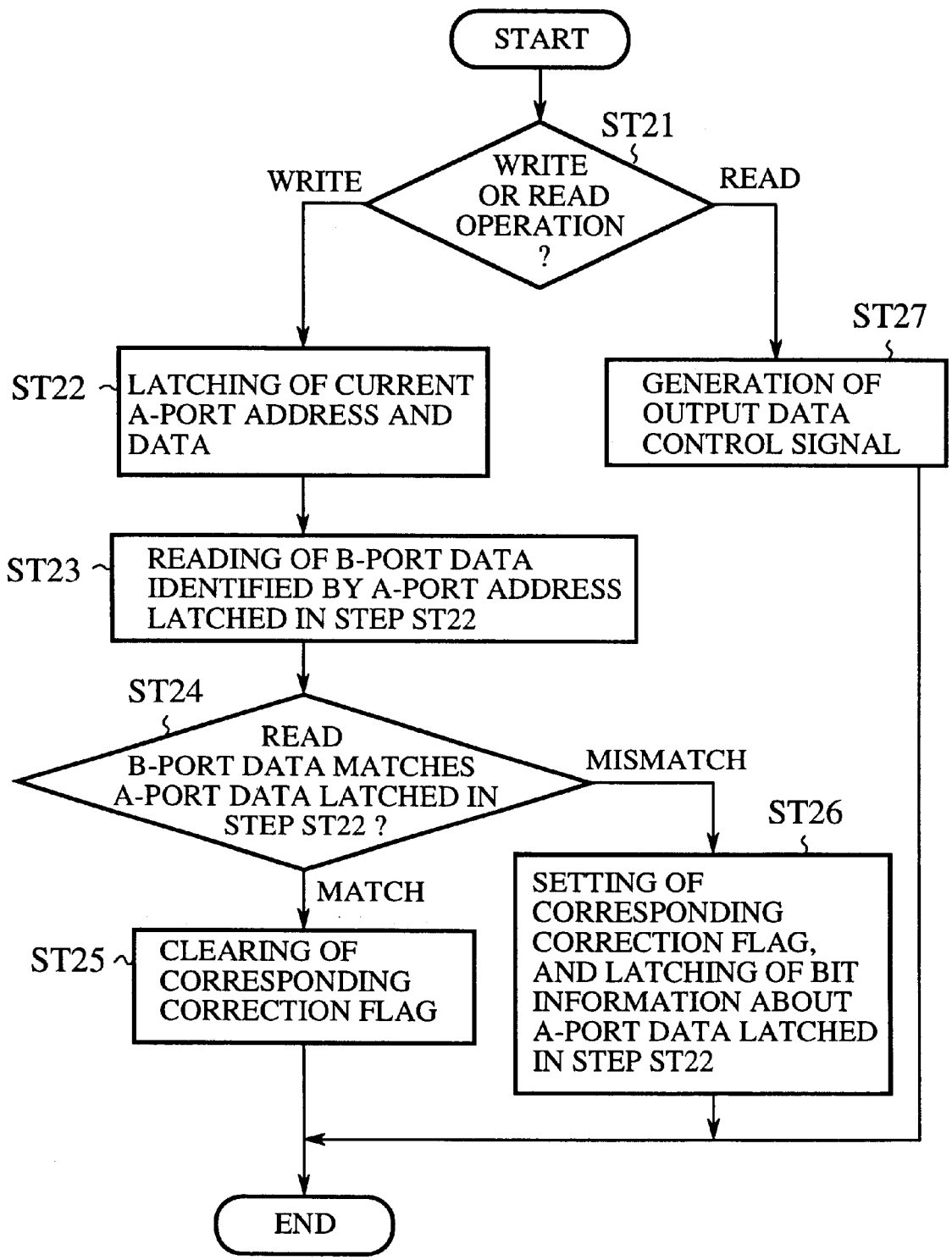
FIG. 12 is a flow diagram showing the operation of the defective-memory-cell address/bit information holding unit according to the fourth embodiment.

Referring next to FIG. 12, there is illustrated a flow diagram showing the operation of the defective-memory-cell address/bit information holding unit 16. When an A-port process starts, the defective-memory-cell address/bit information holding unit 16, in step ST21, determines whether the A-port (or normal-port) process is a write operation or a read operation. When the A-port process is a write operation, the defective-memory-cell address/bit information holding unit 16 advances to step ST22 in which it latches the current A-port address into a defective-memory-cell address register 20 associated with a cleared correction flag 22. Simultaneously, the data latch 14 latches the write data. The comparator 15 then, in step ST23, reads data from the previous address, which is equal to the current A-port address in step ST22, of the memory cell unit 10 by way of the test port (or B port), and, in step ST24, compares the read data with the original write data latched by the data latch 14. When the comparator 15 determines that the read data match the data latched by the data latch 14 in all bits, the defective-memory-cell address/bit information holding unit 16, in step ST25, clears the corresponding correction flag 22 because the correction process is not required for the address. Then the write operation ends. In contrast, when a mismatch has been found in any one of all bits of the write data, the defective-memory-cell address/bit information holding unit 16, in step ST26, sets the corresponding correction flag 22 because the correction process is required for the address, and then latches bit information about one or more bits in which a mismatch has been found into a corresponding bit information register 21 and ends the write operation.

When the A-port process is a read operation, the defective-memory-cell address/bit information holding unit 16 advances to step ST27 in which when the address to which the read access is made matches a defective-memory-cell address stored in a defective-memory-cell address register 20 associated with a set correction flag 22, the defective-memory-cell address/bit information holding unit 16 generates an output data control signal to allow the selector 17 to invert one or more defective bits of the data read out of the memory cell unit 10 via the B port according to the bit information stored in a corresponding bit information register 21. The selector 24 of the defective-memory-cell address/bit information holding unit 16 then furnishes the output data control signal to the selector 17. As a result, the selector 17 inverts one or more defective bits of the data read out of the memory cell unit 10 according to the output data control signal so as to correct the read data, and then furnishes the partially-inverted data (or corrected data) as the read data by way of the data output terminal DO.

As can be seen from the above description, the fourth embodiment of the present invention can offer the same advantages as provided by the first embodiment. That is, the fourth embodiment offers the advantages of improving yields, reducing the cost of testing and the chip cost, preventing the system from malfunctioning, and so forth. In addition to the above-mentioned advantages, the fourth embodiment offers an advantage of being able to further reduce the chip cost because it does not substitute a redundant unit for defective parts of the memory cell unit and, when performing a read operation, corrects one or more defective bits of data read out of the memory cell unit, which need a correction.

Embodiment 5

Figure 13:
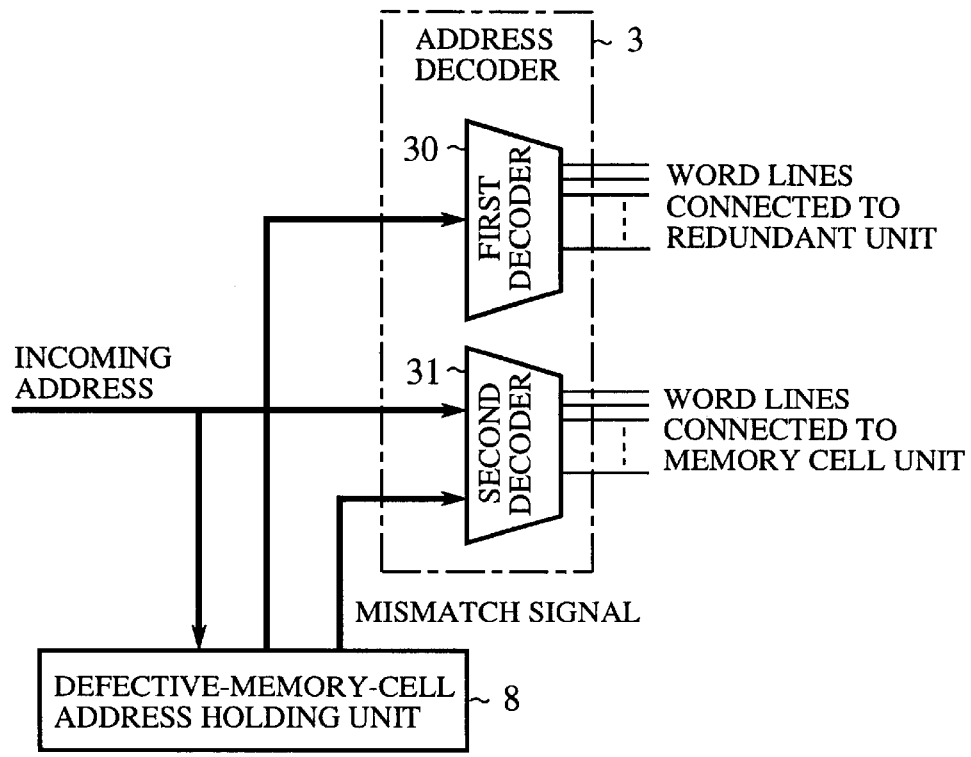
FIG. 13 is a block diagram showing the structure of an address decoding unit for decoding an incoming address, which is included in a semiconductor integrated circuit device according to a fifth embodiment of the present invention.

Referring next to FIG. 13, there is illustrated a block diagram showing the structure of an address decoding unit for decoding an incoming address, which is included in a semiconductor integrated circuit device according to a fifth embodiment of the present invention. In the figure, the same reference numerals as shown in FIG. 1 denote the same components as of the first embodiment, and therefore the description of these components will be omitted hereinafter. Reference numeral 30 denotes a first decoder included in the address decoding unit 3, for activating a word line connected to a redundant unit 2, and numeral 31 denotes a second decoder included in the address decoding unit 3, for activating a word line connected to a memory cell unit 1. In other words, in accordance with the fifth embodiment, the address decoding unit 3 is divided into the first decoder 30 and the second decoder 31.

Figure 14:
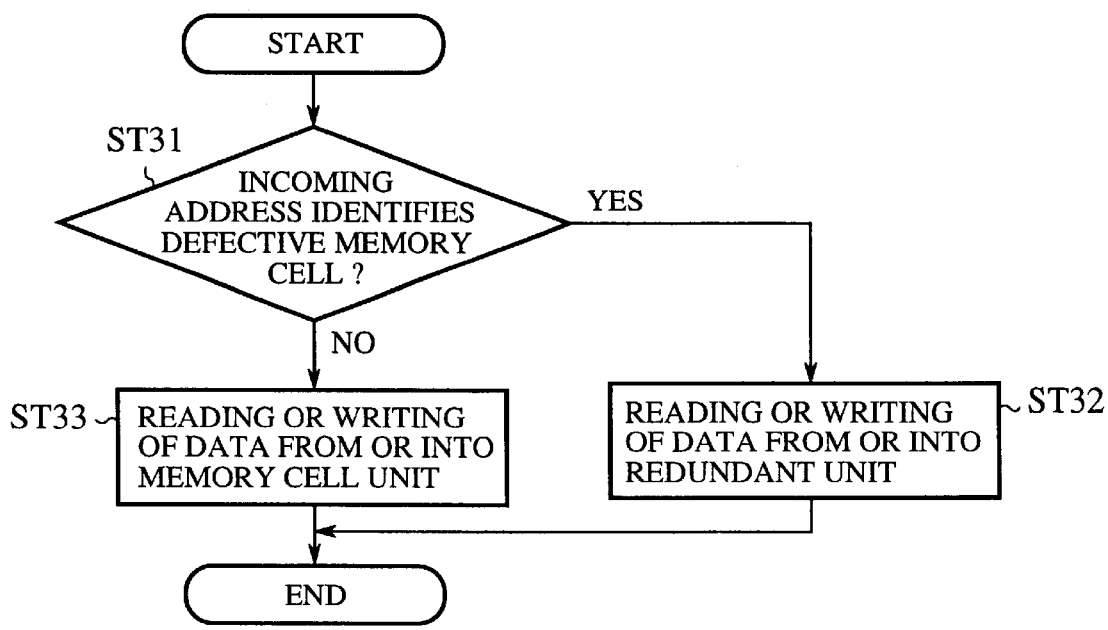
FIG. 14 is a flow diagram showing a read/write operation of the semiconductor integrated circuit device according to the fifth embodiment.

Referring next to FIG. 14, there is illustrated a flow diagram showing the operation of the address decoding unit 3 of the fifth embodiment. When a read or write operation is performed on the memory cell unit 1, the memory block, in step ST31, determines whether an incoming address matches an address stored in the defective-memory-cell address holding unit 8. As a result, when an incoming address matches an address stored in the defective-memory-cell address holding unit 8, it is determined that the memory location of the memory cell unit 1, which is identified by the address, has one or more defective bits. The defective-memory-cell address holding unit 8 then, in step ST32, furnishes the address to the first decoder 30 of the address decoding unit 3 so as to activate a word line connected to the redundant unit 2, which corresponds to the address, so that data can be read out of or written into the redundant unit 2. At the same time, the defective-memory-cell address holding unit 8 clears a mismatch signal to be delivered to the second decoder 31. As a result, any corresponding word line connected to the memory cell unit 1 is not activated.

On the other hand, when an incoming address does not match an address stored in the defective-memory-cell address holding unit 8, it is determined that the memory location of the memory cell unit 1, which is identified by the address, has no defective bit. The defective-memory-cell address holding unit 8 then, in step ST33, sets the mismatch signal so as to activate a word line connected to the memory cell unit 1, which corresponds to the address, so that data can be read out of or written into the memory cell unit 1. At that time, the defective-memory-cell address holding unit 8 furnishes no address to the first decoder 30. As a result, any corresponding word line connected to the redundant unit 2 is not activated.

As can be seen from the above description, in addition to the same advantages as provided by the first embodiment, the fifth embodiment of the present invention can offer an advantage of scaling down the address decoding unit because the memory block activates either a word line connected to the memory cell unit 1 or a word line connected to the redundant unit 2, by determining if an incoming address matches one of defective-memory-cell addresses stored in the defective-memory-cell address holding unit. In addition, since the memory cell unit 1 does not work while the redundant unit 2 is used, the power consumption can be further reduced.

Embodiment 6

Figure 15:
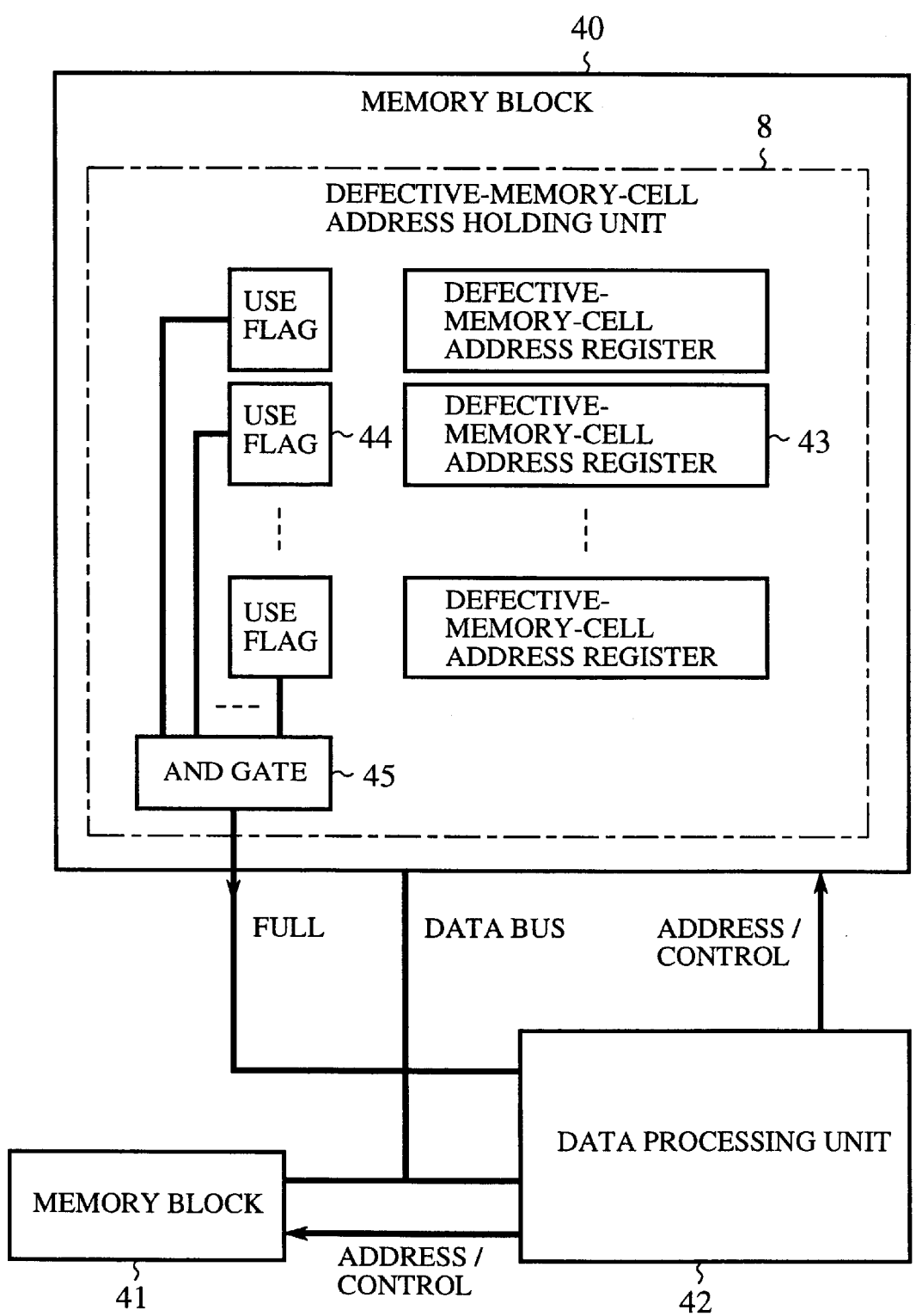
FIG. 15 is a block diagram showing the structure of a main part of a semiconductor integrated circuit device according to a sixth embodiment of the present invention.

Referring next to FIG. 15, there is illustrated a block diagram showing the structure of a main part of a semiconductor integrated circuit device according to a sixth embodiment of the present invention. In the figure, reference numerals 40 and 41 denote memory blocks each having the same structure as that as shown in FIGS. 1, 4, 7, or 10. For simplicity, other components except a defective-memory-cell address holding unit 8 are not shown in FIG. 15. Each of the two memory blocks 40 and 41 can have a defective-memory-cell address/bit information holding unit 16, as shown in FIG. 11, instead of a defective-memory-cell address holding unit 8. FIG. 15 only shows an example of the sixth embodiment in which two memory blocks are provided, and the semiconductor integrated circuit device of the sixth embodiment can have three or more memory blocks. A data processing unit 42 can control the two memory blocks 40 and 41.

Each of the two memory blocks 40 and 41 has a defective-memory-cell address holding unit 8 having the same structure as that as shown in FIG. 1. The defective-memory-cell address holding unit 8 includes a plurality of defective-memory-cell address registers 43, one of which stores an incoming address when a mismatch between original write data associated with the address and corresponding data read out of the memory cell unit has been found. There is a one-to-one correspondence between the plurality of defective-memory-cell address registers 43 and a plurality of memory cells located in a redundant unit 2(not shown in FIG. 15). The defective-memory-cell address holding unit 8 also includes a plurality of use flags 44 one of which is set when a mismatch between original write data associated with an incoming address and corresponding data read out of the memory cell unit has been found and the address is stored in a corresponding defective-memory-cell address register 43. The defective-memory-cell address holding unit 8 further includes an AND gate 45 for implementing a logical AND operation on the plurality of use flags 44 and then furnishes a full flag signal indicating the AND logical operation result to the data processing unit 42.

In operation, when a comparator (not shown in FIG. 15) detects a mismatch between original write data associated with an incoming address and corresponding data read out of the memory cell unit, that is, the comparator determines that a memory cell into which the write data has been written is detective, the defective-memory-cell address holding unit 8 latches the address identifying the defective memory cell into an available one of the plurality of defective-memory-cell address registers 43 and sets a corresponding one of the plurality of use flags 44 to "1". When all the use flags 44 are set, the AND gate 45 that implements a logical AND operation on all the use flags asserts the full flag signal. The full flag signal from the memory block 40 is then furnished to the data processing unit 42. When the full flag signal from the first memory block 40 is asserted, the data processing unit 42 switches to the other memory block 41 so that it will perform a write operation on the second memory block 41 from then on.

Figure 16:
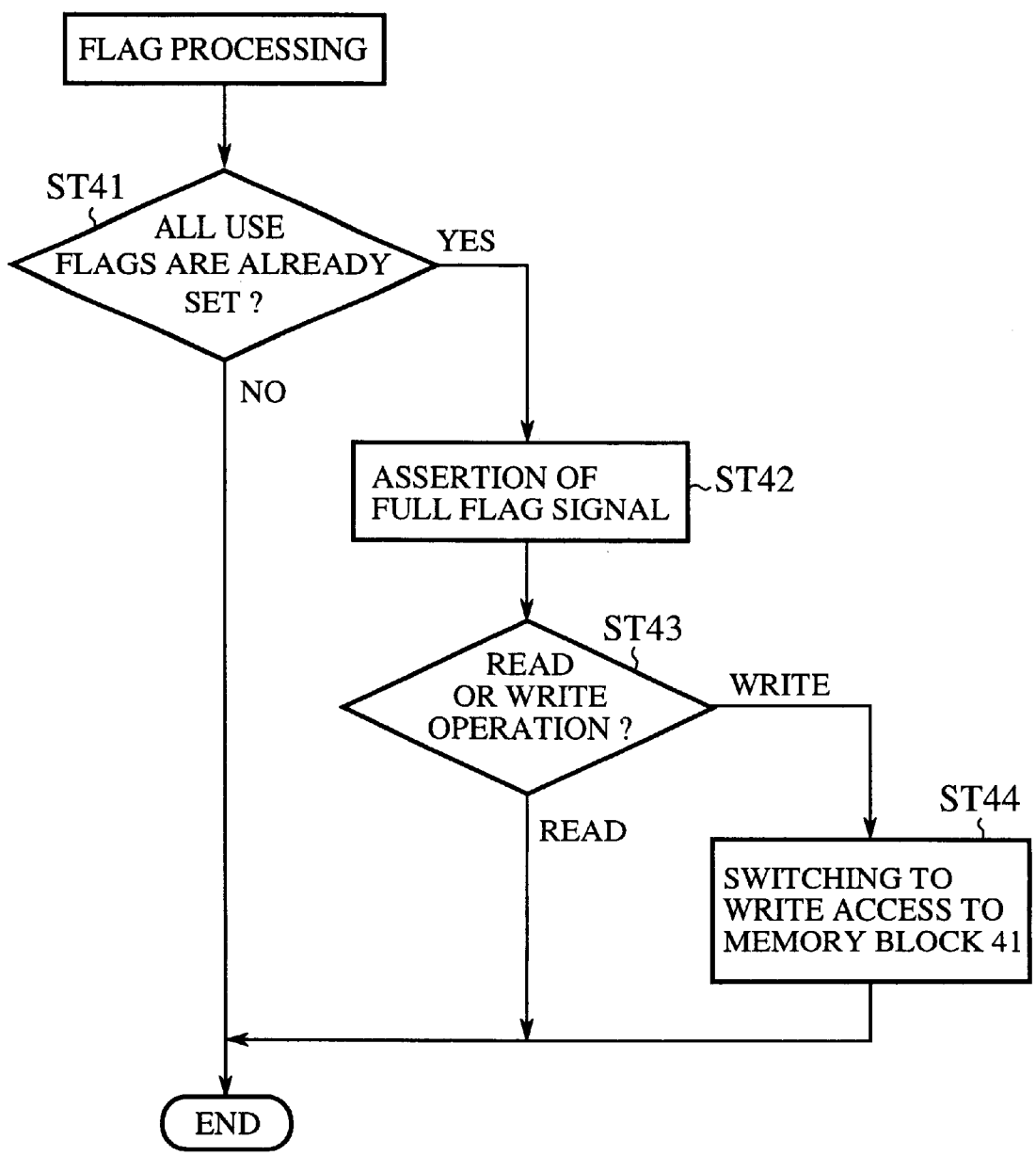
FIG. 16 is a flow diagram showing a flag process of the semiconductor integrated circuit device according to the sixth embodiment.

Referring next to FIG. 16, there is illustrated a flow diagram showing such an operation of switching to writing of data into the other memory block 41. When one use flag 44 is set to "1", the defective-memory-cell address holding unit 8, in step ST41, determines whether or not all the use flags 44 are set to "1" by means of the AND gate 45. When all the flags are set to "1", the ANG gate 45, in step ST42, asserts the full flag signal and then furnishes the asserted full flag signal to the data processing unit 42. The data processing unit 42 receives the asserted full flag signal from the first memory block 40 and then, in step ST43, determines whether the next access is a write operation or another operation other than a write operation. If the next access is an operation other than a write operation, the data processing unit 42 ends this flag process. In contrast, if the next access is a write operation, the data processing unit 42, in step ST44, switches to the other memory block 41 so as to latch write data into the other memory block 41 and then ends the flag process because all the defective-memory-cell address registers 43 of the defective-memory-cell address holding unit 8 of the first memory block 40 are already used and therefore there is a possibility that no write operation is properly performed on the first memory block.

As previously explained, in accordance with the sixth embodiment of the present invention, when both the defective-memory-cell address holding unit 8 (or the defective-memory-cell address/bit information holding unit 16) and the redundant unit 2 cannot take the place of all defective memory cells of the memory cell unit, the memory block asserts the full flag signal and furnishes the asserted full flag signal to the data processing unit 42. Therefore, the sixth embodiment can offer an advantage of warning the system of the necessity for switching to writing of data into another memory block, thus preventing the system from bringing into an error state, in addition to the same advantages as provided by the first embodiment.

Embodiment 7

In the semiconductor integrated circuit device in accordance with the sixth embodiment, when one memory block has run out of its own prepared redundant unit, the memory block asserts the full flag signal so as to warn the system of a switching to writing of data into another buffer (or memory block). In contrast, in accordance with a seventh embodiment of the present invention, when one memory block has run out of its own prepared redundant unit and, after that, a comparator detects a mismatch between original write data and corresponding data read out of a memory cell unit located in the memory block, the memory block asserts an overflow signal OVF.

Figure 17:
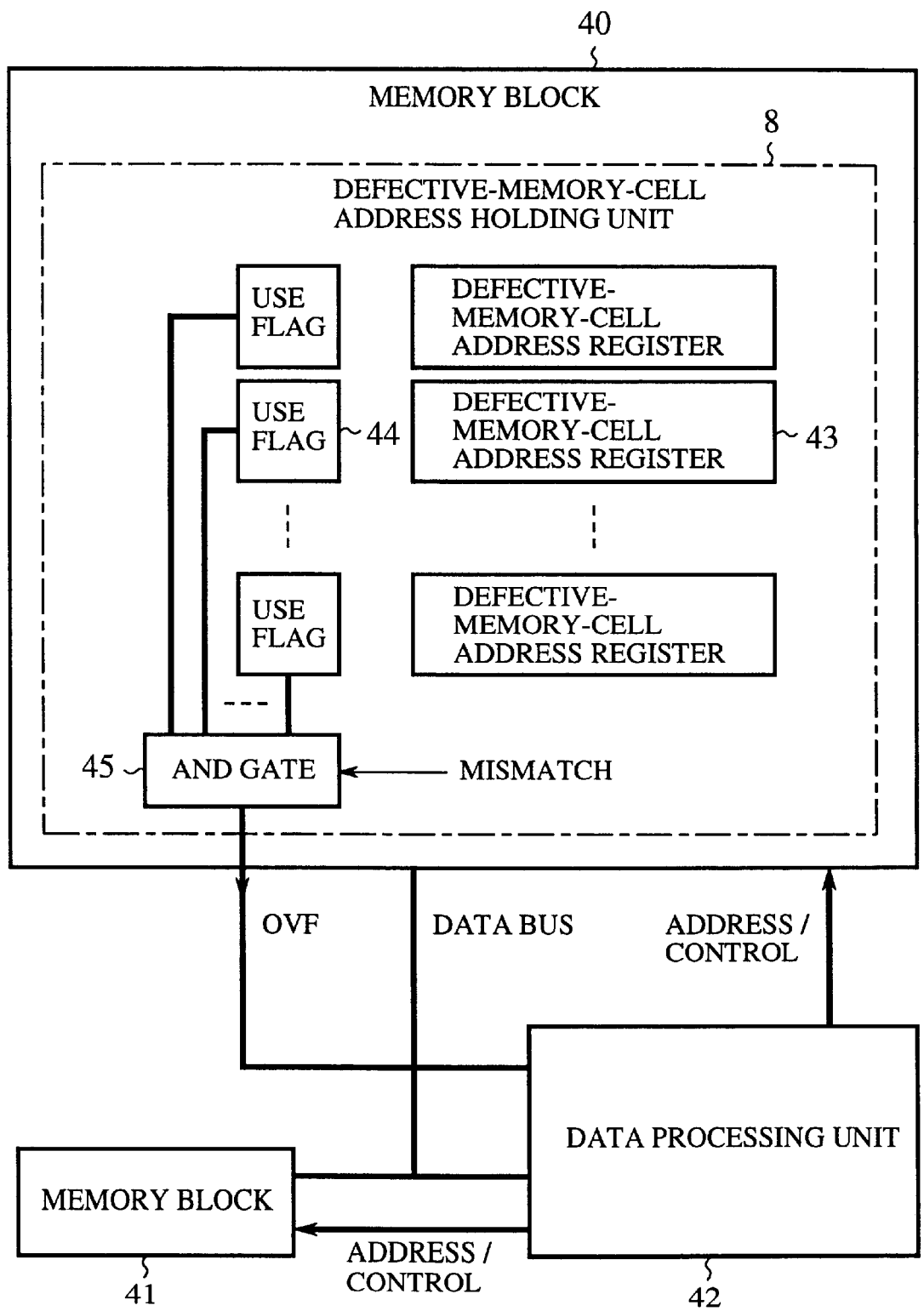
FIG. 17 is a block diagram showing the structure of a main part of a semiconductor integrated circuit device according to a seventh embodiment of the present invention.

Referring next to FIG. 17, there is illustrated a block diagram showing the structure of a main part of a semiconductor integrated circuit device according to the seventh embodiment of the present invention. In the figure, the same reference numerals as shown in FIG. 15 denote the same components as of the semiconductor integrated circuit of the sixth embodiment, and therefore the description of these components will be omitted hereinafter. When all use flags 44 of a first memory block 40 are already set to "1" and a comparator not shown detects a mismatch between original write data and corresponding data read out of a memory cell unit located in the first memory block 40, an AND gate 45 that implements a logical AND operation on all the use flags 44 asserts the overflow signal OVF and furnishes the asserted overflow signal OVF to a data processing unit 42.

In operation, when a memory cell into which original write data associated with an incoming address has been written is detective and the comparator (not shown in FIG. 17) detects a mismatch between the write data and corresponding data read out of the memory cell unit, the defective-memory-cell address holding unit 8 of the first memory block 40 latches the address identifying the defective memory cell into one of a plurality of defective-memory-cell address registers 43 and sets a corresponding one of the plurality of use flags 44 to "1". When all the use flags 44 are already set to "1" and, after that, the comparator not shown detects a mismatch between other original write data and corresponding data read out of the memory cell unit located in the first memory block 40, the AND gate 45 that implements a logical AND operation on all the use flags 44 asserts the overflow signal OVF. The asserted overflow signal OVF from the first memory block 40 is then furnished to the data processing unit 42. When the overflow signal OVF from the first memory block is asserted, the data processing unit 42 switches to the other memory block 41 so that it will perform a write operation on the other memory block 41 from then on.

Figure 18:
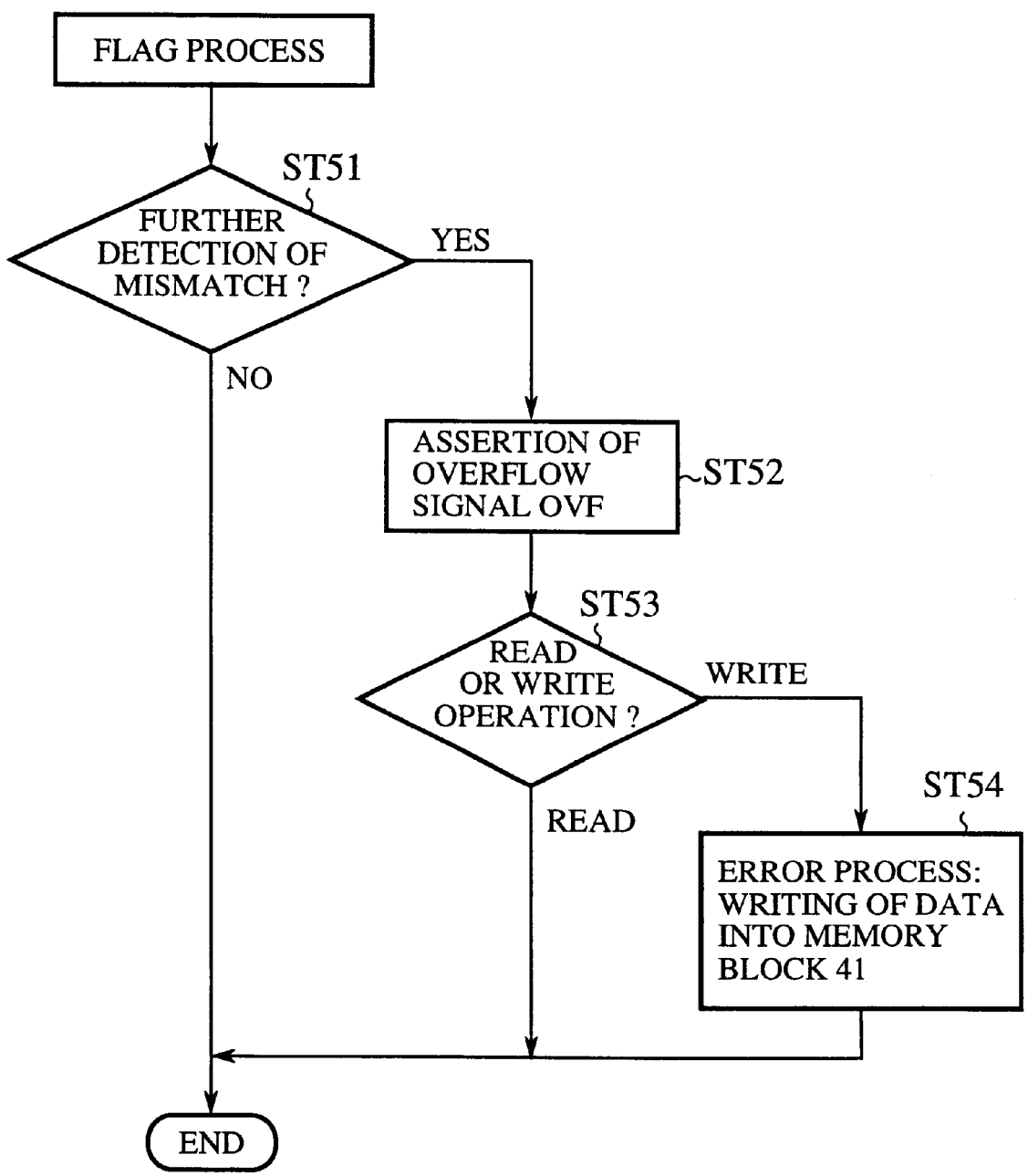
FIG. 18 is a flow diagram showing a flag process of the semiconductor integrated circuit device according to the seventh embodiment.

Referring next to FIG. 18, there is illustrated a flow diagram showing such an operation of switching to writing of data into the other memory block 41. After all the use flags 44 have been set to "1", the comparator (not shown), in step ST51, determines whether there is a further mismatch between original write data and corresponding data read out of the memory cell unit located in the first memory block 40. As a result, when all the use flags are already set to "1" and the comparator further detects a mismatch between original write data and corresponding data read out of the memory cell unit located in the first memory block 40, the ANG gate 45, in step ST52, asserts the overflow signal and then furnishes the asserted overflow signal to the data processing unit 42. The data processing unit 42 receives the asserted overflow signal from the first memory block and then, in step ST53, determines whether the next access is a write operation or a read operation.

When the determination result of step ST53 indicates that the next access is a read operation, the data processing unit 42 ends this flag process. In contrast, if the next access is a write operation, the data processing unit 42, in step ST54, determines that the write operation will not be performed properly, and then performs an error process such as an operation of writing the same write data into the other memory block 41. After that, the data processing unit 42 ends the flag process. In the error process of step ST54, the data processing unit 42 can stop the system and inform someone or something outside the system of the occurrence of a failure in the first memory block 40, instead of writing the same write data into the other memory block 41.

As previously mentioned, in accordance with the seventh embodiment, when both the defective-memory-cell address holding unit 8 (or the defective-memory-cell address/bit information holding unit 16) and the redundant unit 2 cannot take the place of all defective memory cells of the memory cell unit, the memory block asserts the overflow signal OVF and furnishes the asserted overflow signal to the data processing unit 42. Therefore, the seventh embodiment can offer an advantage of being able to make the system perform an error process such as rewriting of write data into the other memory block 41 by asserting the overflow signal OVF, thus preventing the system from malfunctioning. In addition, since even though all the use flags are set to "1", a write access is made to the memory block 40 until a mismatch between write data and corresponding read data is found, the frequency with which the data processing unit 42 perform exceptions using the second memory block 41 can be reduced, thereby preventing a reduction in the system performance.

Embodiment 8

The memory block in accordance with each of the above-mentioned embodiments has only one memory cell unit for simply storing a plurality of data. In contrast, a memory block according to an eighth embodiment of the present invention includes an odd number of memory cell units into each of which identical data is written when performing a write operation so that they have identical contents, and, when performing a read operation, reads data from each of the plurality of memory cell units and then determines the majority of the plurality of data so as to detect a defective memory cell.

Figure 19:
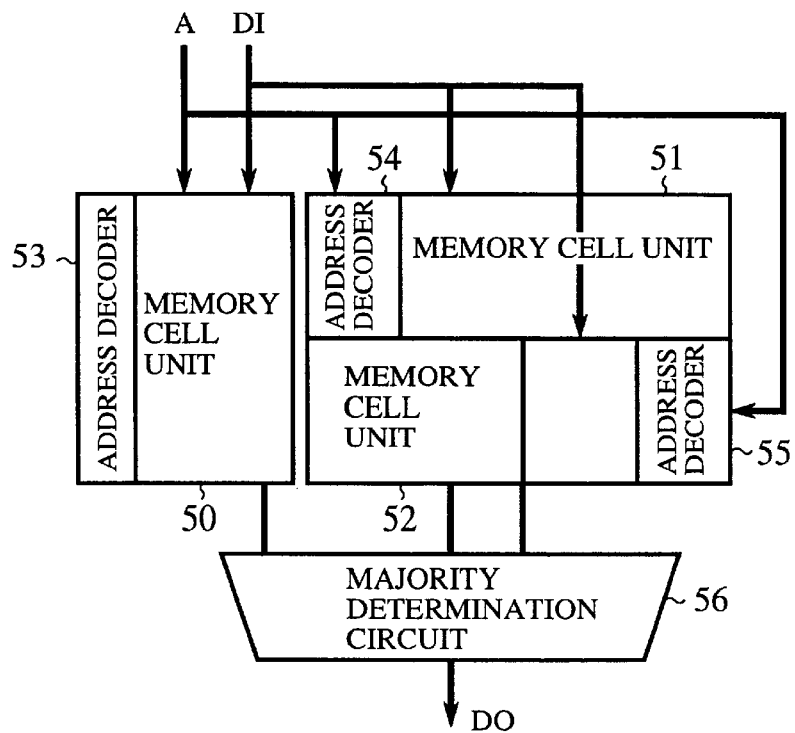
FIG. 19 is a block diagram showing the structure of a main part of a semiconductor integrated circuit according to an eighth embodiment of the present invention.

Referring next to FIG. 19, there is illustrated a block diagram showing the structure of a main part of a semiconductor integrated circuit device according to the eighth embodiment of the present invention. In the figure, reference numerals 50, 51, and 52 respectively denote memory cell units that differ from one another in structure. Needless to say, the number of memory cell units included in the semiconductor integrated circuit device is not limited to 3. The semiconductor integrated circuit device can have five or more memory cell units the number of which is odd. In FIG. 19, reference numerals 53, 54, and 55 denote respective address decoders intended for the plurality of memory cell units 50 to 52, and numeral 56 denotes a majority determination circuit for determining the majority of a plurality of data read out of locations at the same input address of the plurality of memory cell units 50 to 52.

When performing a write operation, the semiconductor integrated circuit device applies write data input from a data input terminal DI to the plurality of memory cell units 50 to 52, and also applies a write address input from an address input terminal A to the plurality of address decoders 53 to 55. The first memory cell unit 50 stores the input write data into a location at the input address decoded by the corresponding address decoder 53. Similarly, the second memory cell unit 51 stores the input write data into a location at the input address decoded by the corresponding address decoder 54, and the third memory cell unit 52 stores the input write data into a location at the input address decoded by the corresponding address decoder 55. Those data written into the plurality of memory cell units 50 to 52 are equal, as mentioned above.

When performing an operation of reading the data written into the plurality of memory cell units 50 to 52, the same address is applied to the address input terminal A. Each of the plurality of memory cell units 50 to 52 reads the data with the input address decoded by each of the plurality of address decoders 53 to 55. The majority determination circuit 56 then determines the majority of the plurality of data read out of the plurality of memory cell units 50 to 52. When all the data read out of the plurality of memory cell units match, the majority determination circuit 56 determines that the memory location identified by the address in each of the plurality of memory cell units is not defective. If two of the plurality of data read out of the plurality of memory cell units match and differ from the remaining data, the majority determination circuit 56 determines that the memory location identified by the address in the memory cell unit from which the remaining data has been read is defective.

As previously mentioned, in accordance with the eighth embodiment, since the memory block determines the majority of three data read from the three memory cell units 50 to 52 by means of the majority determination circuit, it can easily detect defective parts of each of the plurality of memory cell units 50 to 52, thus improving yields. In addition, since the majority determination circuit compares those data read from the three memory cell units 50 to 52 with one another dynamically, there is no need to test the memory block in advance so as to identify defective parts of the plurality of memory cell units, thereby reducing the cost of testing. In addition, since data selected based on majority rule is furnished as the read data, there is no need to change all defective parts into hard-wired parts through a repair process using a hardware technique such as laser trimming, thus reducing the manufacturing cost. Furthermore, since the odd number of memory cell units 50 to 52 differ from one another in structure, it is possible to determine whether or not a failure is due to the difference in structure among the plurality of memory cell units 50 to 52. Also, since the plurality of address decoders 53 to 55 are provided for the plurality of memory cell units 50 to 52, respectively, the memory block makes it possible to repair a failure that occurs in any one of the plurality of address decoders 53 to 55 as well as a failure that occurs in any one of the plurality of memory cell units 50 to 52.

Embodiment 9

Instead of an odd number of memory cell units into which identical data is written when a write operation is performed so that they have identical contents, and a majority determination circuit for determining the majority of a plurality of data read out of the plurality of memory cell units when a read operation is performed, a semiconductor integrated circuit device according to a ninth embodiment of the present invention includes a memory cell unit having an odd number of memory cells, into which identical data is written when a write operation is performed so that they have identical contents, for each of a plurality of addresses, and a majority determination unit for determining the majority of a plurality of data read out of a plurality of memory cells when a read operation is performed, so as to detect a defective memory cell. The memory cell unit of this embodiment has a plurality of sets of memory cells provided for storing each bit of write data, the number of memory cells in each set being three times the required amount of storage for storing each bit of write data.

Figure 20:
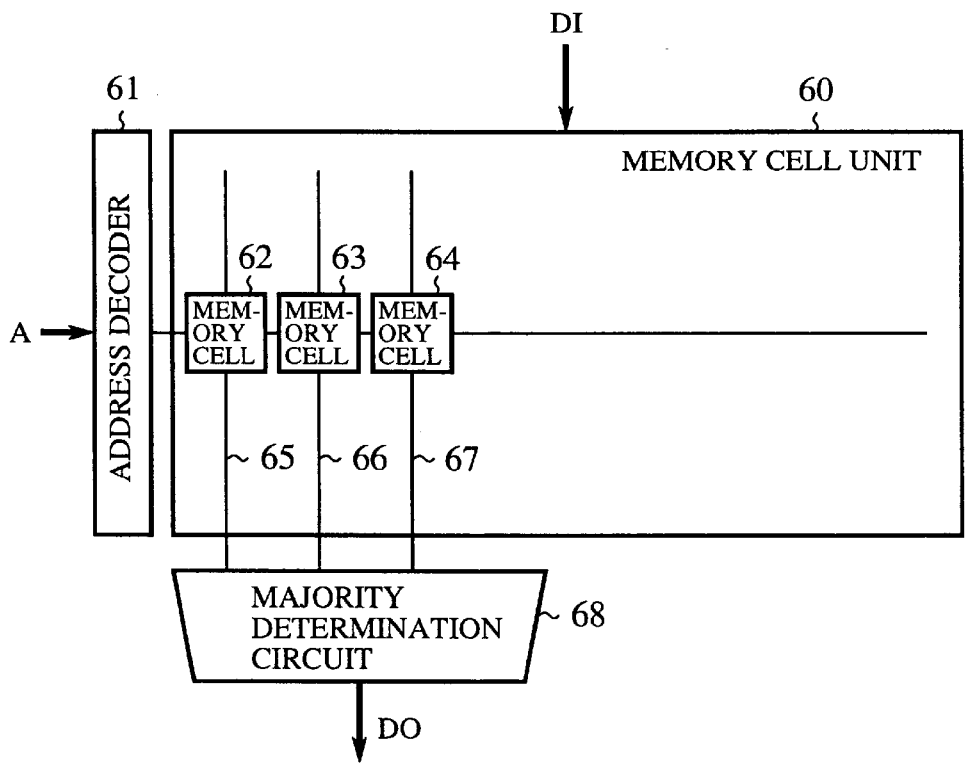
FIG. 20 is a block diagram showing the structure of a main part of a semiconductor integrated circuit according to a ninth embodiment of the present invention.

Referring next to FIG. 20, there is illustrated a block diagram showing the structure of a main part of the semiconductor integrated circuit device according to the ninth embodiment of the present invention. In the figure, reference numeral 60 denotes a memory cell unit, numeral 61 denotes an address decoder, numerals 62, 63, and 64 respectively denote three one-bit memory cells included in the memory cell unit 60. The memory cell unit 60 includes a plurality of sets of three adjacent memory cells, each of which corresponds to each bit of write data to be written into one of a plurality of addresses assigned to the memory cell unit 60. Identical data can be written into each set of three adjacent memory cells. In FIG. 20, reference numerals 65, 66, and 67 denote respective bit lines disposed for a majority determination unit 68 to read a plurality of data from the set of three memory cells 62 to 64. The majority determination circuit 68 can determine the majority of a plurality of data, which are read out of each set of three memory cells.

When performing a write operation, the semiconductor integrated circuit device applies write data input from a data input terminal DI to the memory cell unit 60, and also applies a write address input from an address input terminal A to the address decoder 61. The memory cell unit 60 stores each bit of the input write data into each set of three memory cells at the address decoded by the address decoder 61. Each of the plurality of addresses assigned to the memory cell unit 60 is associated with three memory cells as for each bit. Accordingly, each bit of identical write data input from the data input terminal DI can be written into each set of three adjacent memory cells 62 to 64, for example.

When performing an operation of reading the data written into the plurality of memory cells 62 to 64, the same address is applied to the address input terminal A. The memory cell unit 60 reads the data with the input address decoded by the address decoder 61. Thus a plurality of data, which were simultaneously written into the plurality of adjacent memory cells 62 to 64 when a write operation was performed, are read out of these memory cells. The plurality of data read out of the plurality of neighboring memory cells 62 to 64 are then furnished, by way of the plurality of bit lines 65 to 67, to the majority determination circuit 68. The majority determination circuit 68 determines the majority of the plurality of data read out of the plurality of adjacent memory cells 62 to 64. When all the data read out of the plurality of memory cells match, the majority determination circuit 68 determines that all the memory cells are not defective and hence the corresponding bit is not defective. If two of the plurality of data read out of the plurality of memory cells match and differ from the remaining data, the majority determination circuit 68 determines that the memory cell from which the remaining data has been read is defective and hence the corresponding bit is defective.

As previously mentioned, the memory cell unit 60 has a plurality of sets of memory cells provided for storing each bit of write data, the number of memory cells in each set being 3, i.e., three times the required amount of storage for storing each bit of write data. As an alternative, the number of memory cells in each set can be an odd number greater than 3. The bit lines 65 to 67 connected to the majority determination circuit 68 are not necessarily adjacent to one another. They can be located in the vicinity of one another.

As previously mentioned, in accordance with the ninth embodiment, even if the memory cell unit 60 has a defective part, the memory block can easily identify the defective part by determining the majority of three data read from corresponding three memory cells by means of the majority determination circuit, thus improving yields. In addition, since the majority determination circuit compares those read data with one another dynamically, there is no need to test the memory block in advance so as to identify the defective part of the memory cell unit, thereby reducing the cost of testing. In addition, since data selected based on majority rule is furnished as the read data, there is no need to change all defective parts into hard-wired parts through a repair process using a hardware technique such as laser trimming, thus reducing the manufacturing cost. Furthermore, since the odd number of bit lines 65 to 67 via which read data are transferred to the majority selection circuit 68 and are compared with one another to determine the majority of those read data are located in the vicinity of one another or adjacent to one another, the wiring can be reduced and therefore the power consumption can be reduced. Furthermore, the semiconductor integrated circuit device can be speeded up.

Embodiment 10

Instead of an odd number of memory cell units or a memory cell unit including an odd number of memory cells into which identical data is written when a write operation is performed so that they have identical contents, and a majority determination circuit for determining the majority of the plurality of data read out of the plurality of memory cell units or memory cells when a read operation is performed, and for furnishing the majority as the read data, a semiconductor integrated circuit device according to a tenth embodiment of the present invention includes two memory cell units into which identical data is written when a write operation is performed so that they have identical contents, and a comparator for comparing two data read out of the two memory cell units with each other when a read operation is performed, and for checking a corresponding parity bit when they don't match and furnishing a correct one of the two data read out of the two memory cell units.

Figure 21:
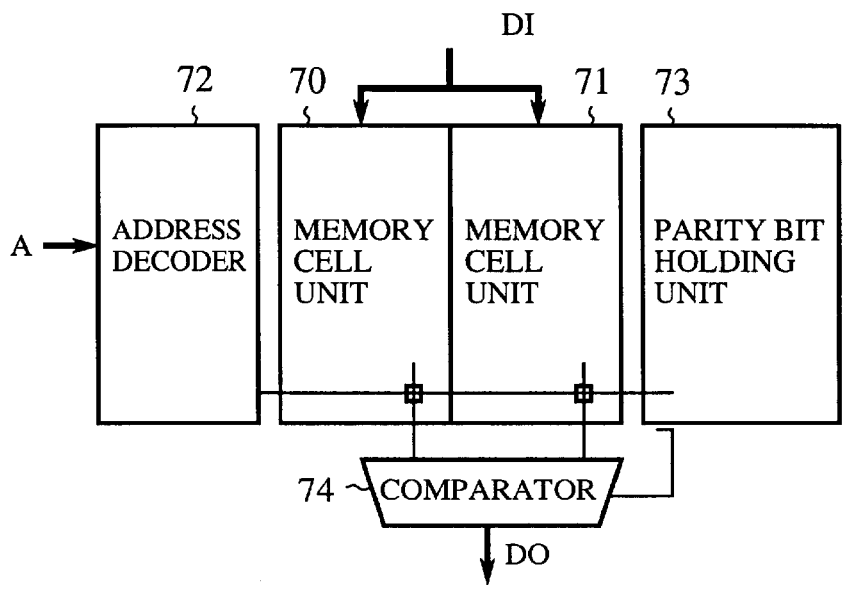
FIG. 21 is a block diagram showing the structure of a main part of a semiconductor integrated circuit according to a tenth embodiment of the present invention.

Referring next to FIG. 21, there is illustrated a block diagram showing the structure of a main part of the semiconductor integrated circuit according to the tenth embodiment of the present invention. In the figure, reference numerals 70 and 71 denotes memory cell units to which the same addresses are assigned, numeral 72 denotes an address decoder for decoding an incoming address identifying the same memory locations of the two memory cell units 70 and 71, numeral 73 denotes a parity bit holding unit for holding a parity bit for each address, which is calculated when a write access to each address is performed, and numeral 74 denotes a comparator for, when a read operation is performed, comparing two data read out of the two memory cell units 70 and 71 with each other, and for checking a corresponding parity bit held by the parity bit holding unit 73 when the two data don't match and furnishing a correct one of them by way of a data output terminal DO.

When performing a write operation, the semiconductor integrated circuit device writes write data input from a data input terminal DI into the same memory locations of the two memory cell units 70 and 71, which are identified by an incoming address decoded by the address decoder 72. Accordingly, the same data is written into the same memory locations of the two memory cell units 70 and 71 which is identified by the same address. The parity bit holding unit 73 calculates a parity bit for the write data and holds the parity bit in a part thereof. When a read access to the address is performed, the address decoder 72 decodes the input address. Then two data are read from the same memory locations of the two memory cell units 70 and 71, which are identified by the decoded address from the address decoder 72, and are then input to the comparator 74. The comparator 74 compares the two input data with each other and checks a corresponding parity bit held by the parity bit holding unit 73 when the two input data don't match, and then furnishes a correct one of the two input data by way of the data output terminal DO.

As previously mentioned, in accordance with the tenth embodiment, even if either one of the two memory cell units 70 and 71 has a defective part, the memory block can correct data read out of the defective part using a corresponding parity bit stored in the parity bit holding unit 73, thus improving yields. In addition, since the comparator 74 compares two data read from the two memory cell units 70 and 71 with each another dynamically, there is no need to test the memory block in advance so as to identify defective parts of the two memory cell units, thereby reducing the cost of testing. Furthermore, since a corrected one of two data read from the two memory cell units 70 and 71 can be selected using a corresponding parity bit stored in the parity bit holding unit 73, there is no need to change all defective parts into hard-wired parts through a repair process using a hardware technique such as laser trimming, thus reducing the manufacturing cost. In addition, since all the comparator has to do is to compare two data read from the two memory cell units 70 and 71 with each other and the number of memory cell units 70 and 71 is thus less than that in the case of determining the majority of an odd number of data read out of an odd number of memory cell units, as mentioned in Embodiment 8, the chip area can be reduced and the chip cost can be reduced.

Embodiment 11

Figure 22:
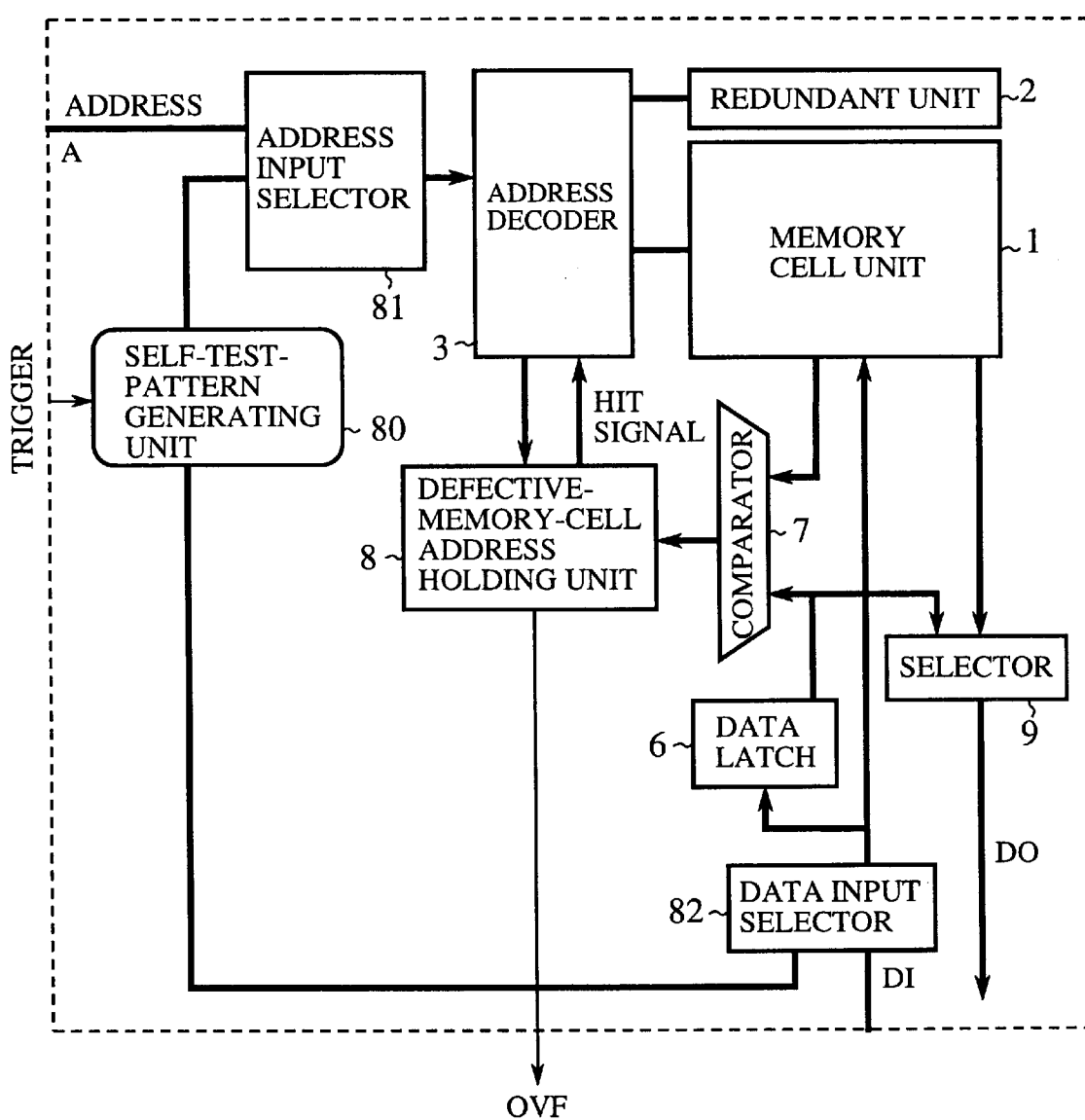
FIG. 22 is a block diagrams showing the structure of a memory block mounted on a semiconductor integrated circuit device according to an eleventh embodiment of the present invention.

Referring next to FIG. 22, there is illustrated a block diagram showing the structure of a memory block mounted on a semiconductor integrated circuit device according to an eleventh embodiment of the present invention. In the figure, reference numeral 1 denotes a memory cell unit, numeral 2 denotes a redundant unit, numeral 3 denotes an address decoder, numeral 6 denotes a data latch, numeral 7 denotes a comparator, numeral 8 denotes a defective-memory-cell address holding unit, and numeral 9 denotes a selector. These components are the same as those of the memory block according to the aforementioned first embodiment as shown in FIG. 1.

Reference numeral 80 denotes a self-test-pattern generating unit for generating a set of test-pattern address and test-pattern data in response to a trigger signal applied thereto, numeral 81 denotes an address input selector for selecting either the test-pattern address generated by the self-test-pattern generating unit 80 or an address input from an address input terminal A, and for furnishing the selected address, as an address identifying a location of the memory cell unit 1, to the address decoder 3, and numeral 82 denotes a data input selector for selecting either the test-pattern data generated by the self-test-pattern generating unit 80 or data input from a data input terminal DI, and for furnishing the selected data to the memory cell unit 1. The memory block according to the eleventh embodiment differs from that of the aforementioned second embodiment in that the memory block according to the eleventh embodiment without a second address decoder 4 and an address latch 5 includes the self-test-pattern generating unit 80, the address input selector 81, and the data input selector 82.

In operation, when the self-test-pattern generating unit 80 receives the trigger signal applied thereto, it starts a self-test operation. When the semiconductor integrated circuit device is turned on, the operation mode is switched to a test mode, or the semiconductor integrated circuit device is reset, the trigger signal is asserted. The self-test-pattern generating unit 80 can generate an arbitrary test pattern, i.e., an arbitrary set of address and data. When the trigger signal is asserted, the memory block of the semiconductor integrated circuit device is brought into a self-test mode. In the self-test mode, the address input selector 81 continues to select the test pattern address output from the self-test pattern generating unit 80, and the data input selector 82 continues to select the test pattern data output from the self-test-pattern generating unit 80, until the self test is completed. While the set of test-pattern address and data generated by the self-test-pattern generating unit 80 is input to the memory cell unit 1, the memory block performs write operations continuously.

When the test-pattern data is input to the memory cell unit 1, the comparator 7 compares the test-pattern data written into the memory cell unit with corresponding data read out of the memory cell unit 1. When the comparator 7 detects a mismatch between them, it determines that the memory cell unit 1 has a defective part and then stores the address which will be processed by the redundant unit 2 from then on, as a defective-memory-cell address, into the defective-memory-cell address holding unit 8. After that, when a read access to the defective part of the memory cell unit 1 is made, data can be read out of a corresponding memory cell in the redundant unit 2 which is identified by the defective-memory-cell address stored in the defective-memory-cell address holding unit 8.

The above-mentioned test operation is done when the semiconductor integrated circuit device is turned on or reset, or the operation mode is switched to a specially-provided test mode. The semiconductor integrated circuit device can thus check whether the memory block has free space enough to store addresses and data in the defective-memory-cell address holding unit 8 and the redundant unit 2 by checking the value of the overflow signal OVF in advance of performing a normal operation. Accordingly, the test operation can be performed as a GO/NG test that is performed prior to shipment. To enable the memory block of the eleventh embodiment perform the test operation, the system simply asserts the trigger signal to switch the memory block to the test mode. While the test operation is performed, all the system has to do is to monitor the overflow signal OVF.

In the above description, an algorithmic test pattern, such as a predefined march or checker test pattern, can be used as a set of address and data, which is generated by the self-test-pattern generating unit 80. As an alternative, a set of address and data that are obtained randomly can be used as a test pattern because there is no need to generate an expected value of a test pattern and compare the expected value with an actual output.

Needless to say, the defective-memory-cell address holding unit 8 can furnish a full flag signal, as explained in Embodiment 6, instead of the overflow signal OVF.

As can be seen from the above description, the eleventh embodiment of the present invention offers the same advantages as provided by the aforementioned first embodiment. That is, the memory block can substitute the redundant unit 2 for defective parts, thereby improving yields. In addition, since there is no need to identify defective parts in advance, the cost of testing can be reduced. Furthermore, the storage amount of the redundant unit 2 can be reduced in consideration with the fact that some data can make a defective memory cell look as if it functions normally. Also, since there is no need to substitute the redundant unit 2 for not-yet-used addresses, the chip cost can be reduced. There is no need to change all defective parts into hard-wired parts through a repair process using a hardware technique such as laser trimming, thus reducing the manufacturing cost. In addition, the memory block can warn the system of the necessity for performing an error process such as switching to writing of data into another memory, thus preventing the system from malfunctioning.

In addition to the above-mentioned advantages, the eleventh embodiment offers an advantage of being able to check whether the memory block has free space enough to store addresses and data in the defective-memory-cell address holding unit 8 and the redundant unit 2 by trigging the memory block to perform the test operation by turning on or resetting the semiconductor integrated circuit device or bringing the memory block into a specially-provided test mode, and then checking the value of the overflow signal OVF from the memory block, in advance of performing a normal operation. The test operation can be performed prior to shipment. To enable the memory block of the eleventh embodiment perform the test operation, the system simply asserts the trigger signal to switch the memory block to the test mode. While the test operation is performed, all the system has to do is to monitor the overflow signal OVF (or full flag signal). Accordingly, the cost of testing can be reduced. In addition, since there is no need to generate an expected value of a test pattern and compare the expected value with an actual output, and all the comparator has to do is to compare write data with corresponding data read out of the memory cell unit, the circuit required for self testing can be simplified and the area of the circuit can be reduced.

Embodiment 12

Figure 23:
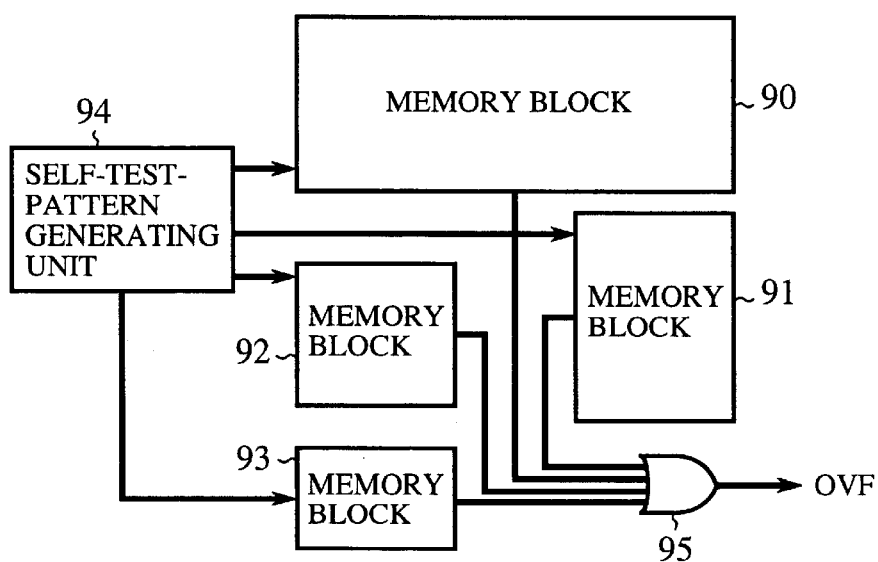
FIG. 23 is illustrated a block diagram showing the structure of a main part of a semiconductor integrated circuit device of a twelfth embodiment of the present invention.

A semiconductor integrated circuit device according to a twelfth embodiment of the present invention includes a self-test-pattern generating unit, as explained in Embodiment 11, which is shared among and located outside a plurality of memory blocks. Referring next to FIG. 23, there is illustrated a block diagram showing the structure of a main part of the semiconductor integrated circuit device of the twelfth embodiment. In the figure, reference numerals 90 to 93 respectively denote memory blocks having the same structure as that of the eleventh embodiment as shown in FIG. 22. However, these memory blocks 90 to 93 differ from the memory block of the eleventh embodiment in that any of them does not include a self-test-pattern generating unit. Reference numeral 94 denotes a self-test-pattern generating unit that is shared among the plurality of memory blocks 90 to 93, for supplying a set of test-pattern address and data to each of the plurality of memory blocks 90 to 93, and numeral 95 denotes an OR gate for implementing a logical OR operation on overflow signals from the plurality of memory blocks 90 to 93, and for furnishing the logical OR operation result as an overflow signal to outside the chip.

Each of the plurality of memory blocks 90 to 93 receives the set of test-pattern address and data generated by the self-test-pattern generating unit 94 that is shared among the plurality of memory blocks 90 to 93. After that, each of the plurality of memory blocks 90 to 93 works in the same way that the memory block of the aforementioned eleventh embodiment does. In other words, each of the plurality of memory blocks 90 to 93 stores information about detected defective parts into its own defective-memory-cell address holding unit 8, and, after that, substitutes memory cells located in a redundant unit 2 for the defective parts according to the information held by the defective-memory-cell address holding unit 8. In a memory block, when the redundant unit 2 lacks free space, the defective-memory-cell address holding unit 8 generates an overflow signal and the OR gate 95 then furnishes the overflow signal to outside the chip. The self-test-pattern generating unit 94 can generate a test pattern in a random fashion so as to allow the plurality of memory blocks to share the test pattern when they are built to different specifications (i.e., they have different bit word sizes).

Needless to say, the defective-memory-cell address holding unit 8 of each memory block can furnish a full flag signal, as explained in Embodiment 6, instead of the overflow signal OVF.

As can be seen from the above description, the twelfth embodiment of the present invention offers an advantage of being able to further reduce the chip cost because the circuitry required for self testing, such as the self-test-pattern generating unit 94 and so on, is shared among the plurality of memory blocks 90 to 93 and the additional circuitry is therefore scaled down. Since the overflow signal or full flag signal is generated as a result of the logical OR operation on the outputs of the plurality of memory blocks 90 to 93, the wiring can be reduced. In addition, since the self-test-pattern generating unit 94 simply generates a test pattern and each of the plurality of memory blocks 90 to 93 performs a comparison between test-pattern data and corresponding data read out of its own memory cell unit, the plurality of memory blocks 90 to 93 that differ from one another in structure can share the self-test-pattern generating unit 94.

Embodiment 13

Figure 24:
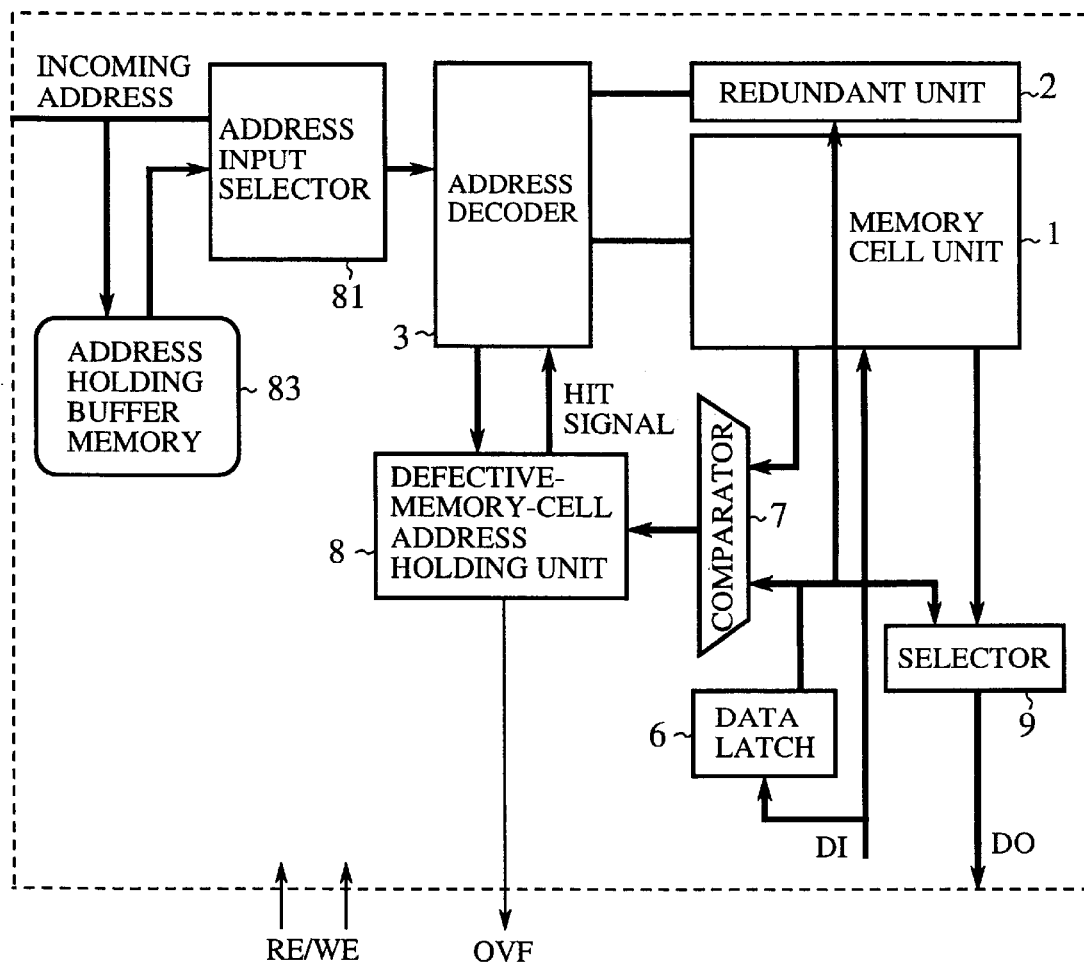
FIG. 24 is a block diagram showing the structure of a memory block mounted on a semiconductor integrated circuit device according to a thirteenth embodiment of the present invention.

Referring next to FIG. 24, there is illustrated a block diagram showing the structure of a memory block mounted on a semiconductor integrated circuit device according to a thirteenth embodiment of the present invention. In the figure, reference numeral 1 denotes a memory cell unit that consists of a one-port RAM, numeral 2 denotes a redundant unit, numeral 3 denotes an address decoder, numeral 6 denotes a data latch, numeral 7 denotes a comparator, numeral 8 denotes a defective-memory-cell address holding unit, numeral 9 denotes a selector, and numeral 81 denotes an address input selector. These components are the same as those of the memory block according to the aforementioned eleventh embodiment as shown in FIG. 22, with the exception that the memory cell unit 1 consists of a one-port RAM. In addition, reference numeral 83 denotes an address holding buffer memory that consists of a one-read/write or 1RW memory with a plurality of words, for holding an incoming address applied to the memory block. Write data is always written into the redundant unit 2.

A read enable or RE signal and a write enable or WE signal are used to control read/write operations. Since the memory cell unit 1 according to the thirteenth embodiment has only one read/write port, the comparator 7 does not always compare original write data written into the memory cell unit 1 with corresponding data read out of the memory cell unit 1 in the next clock cycle after the write operation is performed. To enable the comparator 7 to perform such a comparison operation in the next clock cycle after the write operation is performed, the memory block of the present embodiment latches the incoming address into the address holding buffer memory 83, and latches the write data into the data latch 6.

When both the RE and WE signals are disabled and the address holding buffer memory 83 is holding the incoming address to be tested, the address input selector 81 selects and furnishes the address held by the address holding buffer memory 83 to the address decoder 3. The comparator 7 then compares data read out of a location of the memory cell unit 1 at the address decoded by the address decoder 3 with the original write data latched by the data latch 6. When the comparator 7 detects a mismatch between them, it stores the address into the defective-memory-cell address holding unit 8. In this manner, the comparator 7 works in the same way that that of the second embodiment does, and the defective-memory-cell address holding unit 8 works in the same way that that of the second embodiment does.

Referring next to FIG. 25, there is illustrated a diagram showing the operation of the memory block according to the thirteenth embodiment at every clock cycle. FIG. 25 shows a system operation performed on the memory block, a test operation performed within the memory block, and an address held by the address holding buffer memory 83, at every clock cycle. Next, a description will be made as to the operation of the memory block with reference to FIG. 25.

In the first clock cycle, a write access to an address A is made. When the write operation is performed, the address holding buffer memory 83 holds the address data "A" and the data latch 6 latches original write data. In the second clock cycle, the RE and WE signals are disabled because no read/write operations are performed. During the second clock cycle, the comparator 7 reads corresponding data from a memory cell at the address A of the memory cell unit 1 according to the address data "A" held by the address holding buffer memory 83, and then compares the read data with the write data latched by the data latch 6. As a result, when the comparator 7 detects a mismatch between the read data and the write data, it stores the address data, as a defective-memory-cell address, into the defective-memory-cell address holding unit 8. In contrast, when comparator 7 detects a match between the read data and the write data, it does not store the address data into the defective-memory-cell address holding unit 8.

In the third clock cycle, a read access to the address A is made. When a mismatch was found resulting from the test operation performed in the second clock cycle, data is read from a corresponding memory cell of the redundant unit 2, which is identified by the above-mentioned defective-memory-cell address. In contrast, when a match was found resulting from the test operation performed in the second clock cycle, data is read from a memory cell at the address A of the memory cell unit 1. Since the test operation for the address A was completed in the second clock cycle, the address data "A" is cleared from the address holding buffer memory 83 in the third clock cycle.

In the fourth clock cycle, while the RE and WE signals are disabled because no read/write operation is performed, the address holding buffer memory 83 is cleared. The comparator 7 therefore performs no comparison operation.

In the fifth clock cycle, a write access to an address B is made. When the write operation is performed, the address holding buffer memory 83 holds the address data "B" and the data latch 6 latches write data, like in the first clock cycle. When a write access to an address C is made in the sixth clock cycle, the address holding buffer memory 83 further holds the address data "C" as well as the address data "B" which was latched in the fifth clock cycle, and the data latch 6 latches write data written into the address C. If no read/write operation is performed in the seventh clock cycle, the comparator 7 reads data from a memory cell at the address B of the memory cell unit 1 according to the address data "B" held by the address holding buffer memory 83, and then compares the read data with the first write data latched by the data latch 6. In the eighth clock cycle, if no read/write operation is performed, the comparator 7 reads data from a memory cell at the address C of the memory cell unit 1 according to the address data "C" held by the address holding buffer memory 83, and then compares the read data with the second write data latched by the data latch 6. In addition, the address data "B" is cleared from the address holding buffer memory 83.

After that, every time a write operation is performed, address data associated with the write access is latched into the address holding buffer memory 83 and write data is latched into the data latch 6. Then, in a next clock cycle in which no write or read operation is performed, that is, the RE and WE signals are disabled, the comparator 7 reads data from a memory cell of the memory cell unit 1 according to the address data held by the address holding buffer memory 83, and then compares the read data with the write data latched by the data latch 6. After the comparison, the address data is cleared from the address holding buffer memory 83 and the write data is cleared from the data latch 6.

A read/write or RW signal and a chip select or CS signal (i.e., module select signal) can be used to control read/write operations, instead of the RE and WE signals.

As can be seen from the above description, the thirteenth embodiment of the present invention offers the same advantages as provided by the aforementioned first embodiment. That is, the memory block can substitute the redundant unit 2 for defective parts, thereby improving yields. In addition, since there is no need to identify defective parts in advance, the cost of testing can be reduced. Furthermore, the storage amount of the redundant unit 2 can be reduced in consideration with the fact that some data can make a defective memory cell look as if it functions normally. Also, since there is no need to substitute the redundant unit 2 for not-yet-used addresses, the chip cost can be reduced. There is no need to change all defective parts into hard-wired parts through a repair process using a hardware technique such as laser trimming, thus reducing the manufacturing cost. In addition, the memory block can warn the system of the necessity for performing an error process such as switching to writing of data into another memory, thus preventing the system from malfunctioning.

In addition to the above-mentioned advantages, the thirteenth embodiment offers an advantage of being able to employ one memory cell unit with one port because the memory block performs a repair process within a time period during which no read/write operation is performed. In general, since a one-port memory has a smaller area, the chip can be scaled down and the manufacturing cost can be reduced.

Embodiment 14

Figure 26:
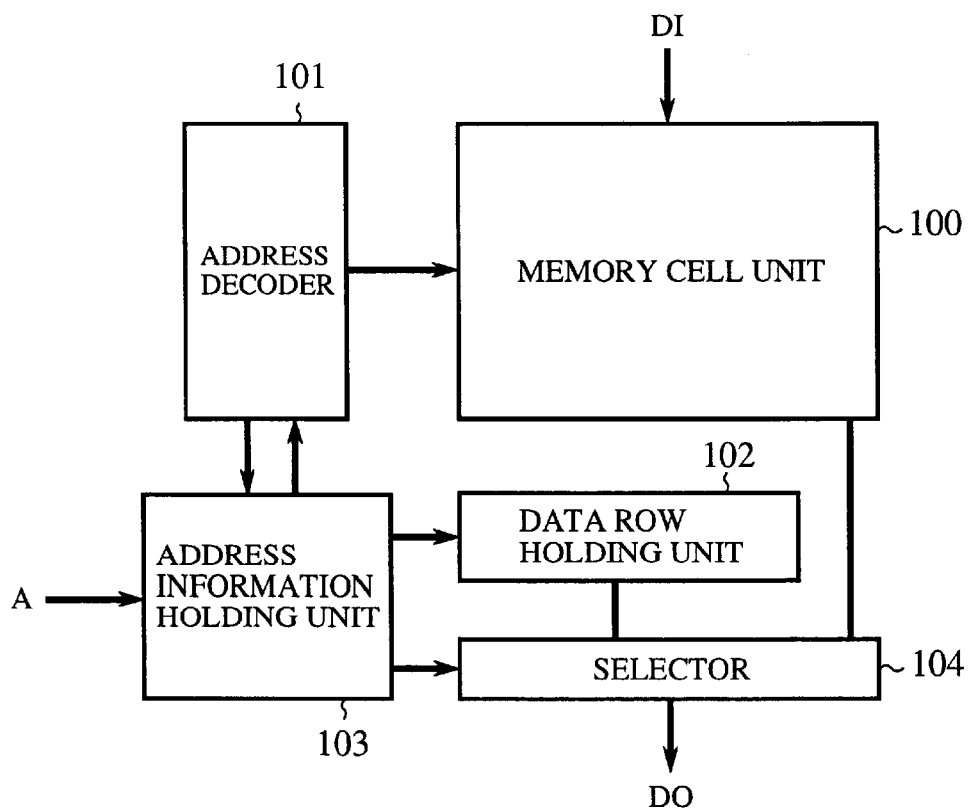
FIG. 26 is a block diagram showing the structure of a memory block mounted on a semiconductor integrated circuit device according to a fourteenth embodiment of the present invention.

Referring next to FIG. 26, there is illustrated a block diagram showing the structure of a memory block mounted on a semiconductor integrated circuit device according to a fourteenth embodiment of the present invention. In the figure, reference numeral 100 denotes a memory cell unit that serves as a main data storage, numeral 101 denotes an address decoder intended for the memory cell unit 100, and numeral 102 denotes a data row holding unit for holding one or more data rows which are frequently accessed or which needs to be accessed at a higher speed. The data row holding unit 102 can include a plurality of memory cells to store a plurality of data rows. The data row holding unit 102 has a storage amount that is less than that of the memory cell unit 100. Furthermore, reference numeral 103 denotes an address information holding unit for holding address information about addresses identifying locations of the data row holding unit 102 where data rows are stored, and numeral 104 denotes a selector for selecting either data read out of the data row holding unit 102 or data read out of the memory cell unit 100, and for furnishing the selected data by way of a data output terminal DO.

A plurality of predefined data rows, such as a data row with all bits set to 0 and a data row with all bits set to 1, are stored in the data row holding unit 102. When the memory block is used as an instruction memory, a plurality of data rows that are frequently used, such as NOP, are stored in the data row holding unit 102. Each predefined data row or each data row that is frequency used can be read from the data row holding unit 102 having a small storage amount rather than the memory cell unit 100 having a large storage amount, thus reducing the power consumption. Similarly, data rows, such as arithmetic operation instructions that take much processing time, are also stored in the data row holding unit 102. Each arithmetic operation instruction can be read from the data row holding unit 102 having a small storage amount rather than the memory cell unit 100 having a large storage amount, thus speeding up read access to any instruction stored in the data row holding unit 102 and therefore increasing the amount of time assigned for the execution of the arithmetic operation in an execution cycle.

In order to reduce the access time required for accessing each data row stored in the data row holding unit 102, corresponding address information from an address input terminal A is applied to the address information holding unit 103 first, prior to being input to the address decoder 101. In addition, the data row holding unit 102 is located in the vicinity of a data output terminal DO and hence the selector 104.

When an access to the data row holding unit 102 is made, the address information holding unit 103 supplies the address information held thereby to the data row holding unit 102. The address information holding unit 103 then controls the selector 104 so that it selects data read out of the data row holding unit 102 and furnishes the selected data by way of the data output terminal DO. At that time, no address information is transferred from the address information holding unit 103 to the address decoder 101 and both the memory cell unit 100 and the address decoder 101 are deactivated. The memory cell unit 100 can work in synchronization with a clock signal. In this case, stopping the supply of the clock signal to the memory cell unit 100 can deactivate both the memory cell unit 100 and the address decoder 101. The address information holding unit 103 has such a function of controlling the operations of the memory cell unit 100 and the address decoder 101.

The data row holding unit 102 can employ a RAM when frequently used data rows change with a change in operation conditions. In contrast, when frequency used data rows and data rows that need to be accessed at a high speed are known in advance, the data row holding unit 102 can employ a ROM.

As previously mentioned, in accordance with the fourteenth embodiment of the present invention, the data row holding unit 102 holding data rows that are used frequently and that need to be accessed at a high speed has a smaller amount of storage than the memory cell unit 100 has. Accordingly, the wiring via which data read out of the data row holding unit is transmitted can have a small capacity. In addition, when the data row holding unit 102 is located in the vicinity of the data output terminal DO, the capacity of the wiring can be further reduced and therefore the access to any data row can be speeded up. When accessing the data row holding unit 102, inhibiting any access to the memory cell unit 100 avoids the necessity for charging and discharging the memory cell unit 100 having a large capacity, thereby reducing the power consumption. When a ROM is used as the data row holding unit 102, the chip area can be reduced.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor integrated circuit device comprising:

a memory cell means having a normal port via which a normal read/write operation is performed, and a test port intended for tests, via which data can be read out of said memory cell means;

a data latch means for temporarily latching write data, which is written into said memory cell means by way of the normal port;

a comparator means for reading the data, which has been written into said memory cell means by way of the normal port, from said memory cell means by way of the test port, and for comparing the read data with the original write data latched by said data latch means;

a redundant means for latching the write data to take the place of said memory cell means when said comparator means detects a mismatch between the data read by said comparator means and the write data latched by said data latch means; and an address holding means for holding information on an address identifying a location of said memory cell means into which the write data has been written when said comparator means detects a mismatch between the data read by said comparator means and the write data.

2. The semiconductor integrated circuit device according to claim 1, wherein said data latch means includes a plurality of data latches each for temporarily latching write data, which is written into said memory cell means by way of the normal port, and wherein when reading data from a location at an address, in which a mismatch was found by said comparator means, of said memory cell means for the first time, said device furnishes write data latched by a corresponding one of said plurality of data latches, and, from then on, when performing a write/read operation to access the address, directly accesses said redundant means that is holding the write data associated with the address stored in said address holding means without performing a comparison by means of said comparator means.

3. The semiconductor integrated circuit device according to claim 1, wherein said data latch means includes only one data latch for temporarily latching write data, which is written into said memory cell means by way of the normal port, and wherein when the write data is written into said memory cell means, said comparator means compares the write data latched by said data latch with corresponding data read out of said memory cell means, and, if said comparator means detects a mismatch between them, said redundant means latches the write data and said address holding means latches an address identifying a location of said memory cell means into which the write data has been latched, and wherein, after that, when said comparator means performs a comparison associated with the same address and then detects a match, the address is cleared from said address holding means or the address can be overwritten with a new one, and the write data is cleared from said redundant means or the write data can be overwritten with new data.

4. The semiconductor integrated circuit device according to claim 1, wherein said data latch means includes only one data latch for temporarily latching write data, which is written into said memory cell means by way of the normal port, and wherein when the write data is written into said memory cell means, said redundant unit latches the write data and said address holding means latches an address identifying a location of said memory cell means into which the write data has been latched, and said comparator means compares the write data latched by said data latch with corresponding data read out of said memory cell means, and, if said comparator means detects a mismatch between them, said redundant means keeps holding the write data latched thereinto and said address holding means keeps holding the address latched thereinto, otherwise, the address is cleared from said address holding means or the address can be overwritten with a new one, and the write data is cleared from said redundant means or the write data can be overwritten with new data.

5. The semiconductor integrated circuit device according to claim 1, further comprising an address decoder means for decoding an incoming address applied thereto when performing a read/write operation, said address decoder means including a first decoder for activating word lines connected to said redundant means, and a second decoder for activating word lines connected to said memory cell means, wherein said address holding means determines whether or not it is holding an address equal to the incoming address, and, if said address holding means determines that it is holding an address equal to the incoming address, said first decoder activates a corresponding word line connected to said redundant means, and, otherwise, said second decoder activates a corresponding word line connected to said memory cell means.

6. The semiconductor integrated circuit device according to claim 1, wherein when said redundant means does not have free space enough to take the place of said memory cell means, said device asserts a full flag signal.

7. The semiconductor integrated circuit device according to claim 1, wherein when said redundant means does not have free space enough to take the place of said memory cell means and said comparator means detects a mismatch between write data latched by said data latch means and corresponding data read out of said memory cell means, said device asserts an overflow signal.

8. A semiconductor integrated circuit device comprising:
   a memory cell means having a normal port via which a read/write operation is performed, and a test port intended for tests, via which data can be read out of said memory cell means;
   a data latch means for temporarily latching write data, which is written into said memory cell means by way of the normal port;
   a comparator means for reading the data, which has been written into said memory cell means by way of the normal port, from said memory cell means by way of the test port, and for comparing the read data with the original write data latched by said data latch means bit by bit;
   an address and bit information holding means for, if said comparator means detects a mismatch between the data read by said comparator means and the write data, holding information on an address identifying a location of said memory cell means into which the write data has been written and bit information about one or more bits of the write data in which a mismatch has been found by said comparator means; and
   a means for, when reading the data from the address of said memory cell means, in which a mismatch was found by said comparator means, inverting one or more bits of the data read out of said memory cell means according to the bit information stored in said address and bit information holding means.

9. A semiconductor integrated circuit device comprising:
   an odd number of memory cell units having respective address decoders and having different structures, the number of memory cell units being greater than or equal to three, identical write data being written into said plurality of memory cell units when a write operation is performed so that they have identical contents; and
   a majority determination means for, when a read operation is performed and an identical address is applied to said plurality of memory cell units, determining a majority of an odd number of data which are read out of locations identified by the address of said plurality of memory cell units, so as to determine if each of said plurality of memory cell units has a defective part, and for furnishing the majority as read data.

10. A semiconductor integrated circuit device comprising:
   a memory cell means including an odd number of memory cells into which each bit of write data is written when a write operation is performed so that they have identical contents, the number of memory cells being greater than or equal to three; and
   a majority determination means for, when a read operation is performed on the write data written into said memory cell means, determining a majority of an odd number of one-bit data corresponding to each bit of the write data which are read out of said plurality of memory cells, so as to determine whether or not each of said plurality of memory cells for storing each bit of the write data is defective, and for furnishing the majority as each bit of read data.

11. A semiconductor integrated circuit device comprising:

a plurality of memory cell units into which identical write data is written when a write operation is performed so that they have identical contents;

a parity bit holding means for, when the write data is written into said plurality of memory cell units, calculating and holding a parity bit for the write data; and a comparator means for, when a read operation is performed, comparing a plurality of data read out of said plurality of memory cell units with one another, and for, unless they are equal to one another, checking the parity bit stored in said parity bit holding means and selecting a correct one of said plurality of data read from said plurality of memory cell units to furnish the selected data.

12. A semiconductor integrated circuit device including at least a memory block, said device comprising:

a self-test-pattern generating means for generating and furnishing a set of address and data, as a test pattern, to said memory block; and said memory block including a memory cell means, a data latch means for temporarily latching write data, which is written into said memory cell means, a comparator means for reading the data, which has been written into said memory cell means, from said memory cell means, and for comparing the read data with the original write data latched by said data latch means, a redundant means for latching the write data to take the place of said memory cell means from then on when said comparator means detects a mismatch between the data read by said comparator means and the write data, an address holding means for holding information on an address identifying a location of said memory cell means into which the write data is written when said comparator means detects a mismatch between the data read by said comparator means and the write data, an address input selector for selecting and furnishing an address, which is applied thereto from said self-test-pattern generating means when said memory cell means is tested, to said memory cell means, and a data input selector for selecting and furnishing data, which is applied thereto from said self-test-pattern generating means when said memory cell means is tested, to said memory cell means.

13. The semiconductor integrated circuit device according to claim 12, wherein said device comprises a plurality of memory blocks, each having said memory cell means, said comparator means, said redundant means, said address holding means, said address input selector, and said data input selector, and said self-test-pattern generating means furnishes a set of address and data, as a test pattern, to said plurality of memory blocks when testing said plurality of memory blocks, and wherein each of said plurality of memory blocks furnishes a full flag signal when said redundant means thereof does not have free space enough to take the place of said memory cell means thereof, and said device further comprises an OR gate for implementing a logical OR operation on a plurality of full flag signals from said plurality of memory blocks.

14. The semiconductor integrated circuit device according to claim 12, wherein said device comprises a plurality of memory blocks, each having said memory cell means, said comparator means, said redundant means, said address holding means, said address input selector, and said data input selector, and said self-test-pattern generating means furnishes a set of address and data, as a test pattern, to said plurality of memory blocks when testing said plurality of memory blocks, and wherein each of said plurality of memory blocks furnishes an overflow flag signal when said redundant means thereof does not have free space enough to take the place of said memory cell means thereof and said comparator means thereof detects a mismatch between write data and corresponding data read out of said memory cell means, and said device further comprises an OR gate for implementing a logical OR operation on a plurality of overflow signals from said plurality of memory blocks.

15. A semiconductor integrated circuit device comprising:

a memory cell means;

a data latch means for temporarily latching write data, which is written into said memory cell means;

a comparator means for reading the data, which has been written into said memory means, from said memory cell means, and for comparing the read data with the original write data latched by said data latch means;

a redundant means for latching the write data to take the place of said memory cell means after then on when said comparator means detects a mismatch between the data read by said comparator means and the write data;

an address buffer means for latching an incoming address identifying a location of said memory cell means into which the write data is written;

an address holding means for holding information about the incoming address when said comparator means detects a mismatch between the data read by said comparator means and the write data; and an address input selector for reading the incoming address from said address buffer means when any read/write operation is disabled, and furnishing the address to said memory cell means, wherein only when any read/write operation is disabled, said comparator means is enabled.

16. A semiconductor integrated circuit device comprising:

a memory cell means;

a data row storage means for storing one or more data rows that are frequently accessed and one or more data rows that need much time to be processed, said data row means having a smaller storage amount than said memory cell means has; and an address information storage mean for storing addresses identifying locations of said data row storage means where data rows are stored, and for, when an access to a data row that is frequently accessed or that needs much time to be processed is made, selecting and furnishing an address identifying a location where the data row is stored to said data row storage means.

* * * * *